United States Patent
Najafi

(10) Patent No.: US 11,585,695 B1
(45) Date of Patent: Feb. 21, 2023

(54) SELF-TRIAGING PHOTON DETECTOR

(71) Applicant: PsiQuantum Corp., Palo Alto, CA (US)

(72) Inventor: Faraz Najafi, Palo Alto, CA (US)

(73) Assignee: PSIQUANTUM CORP., Palo Alto, CA (US)

(*) Notice: Subject to any disclaimer, the term of this patent is extended or adjusted under 35 U.S.C. 154(b) by 215 days.

(21) Appl. No.: 17/073,246

(22) Filed: Oct. 16, 2020

Related U.S. Application Data

(60) Provisional application No. 62/924,142, filed on Oct. 21, 2019.

(51) Int. Cl.
*G01J 1/44* (2006.01)
*G01J 1/04* (2006.01)
*H03K 17/94* (2006.01)

(52) U.S. Cl.
CPC ............ *G01J 1/44* (2013.01); *G01J 1/0407* (2013.01); *H03K 17/941* (2013.01); *G01J 2001/442* (2013.01); *G01J 2001/4446* (2013.01)

(58) Field of Classification Search
CPC ...... G01J 1/44; G01J 1/0407; G01J 2001/442; G01J 2001/4446; H03K 17/941
See application file for complete search history.

(56) References Cited

U.S. PATENT DOCUMENTS

| | | | |
|---|---|---|---|
| 3,059,196 A | 10/1962 | Lentz | |
| 3,119,076 A | 1/1964 | Schlig et al. | |
| 3,283,282 A | 11/1966 | Rosenberg | |
| 4,336,561 A | 6/1982 | Murphy | |
| 4,365,317 A | 12/1982 | Gheewala | |
| 4,509,146 A | 4/1985 | Wang et al. | |
| 4,647,954 A | 3/1987 | Graf et al. | |
| 4,989,051 A | 1/1991 | Whitehead et al. | |
| 5,026,682 A | 6/1991 | Clark et al. | |

(Continued)

FOREIGN PATENT DOCUMENTS

| CN | 106289515 A | 1/2017 |
|---|---|---|
| CN | 106549099 | 3/2017 |

(Continued)

OTHER PUBLICATIONS

Psiquantum, International Preliminary Report on Patentability, PCT/US2019/016885, dated Aug. 11, 2020, 7 pgs.

(Continued)

*Primary Examiner* — Thanh Luu
(74) *Attorney, Agent, or Firm* — Morgan, Lewis & Bockius LLP

(57) ABSTRACT

A photon detecting component is provided. The photon detecting component includes a first waveguide and a detecting section. The detecting section includes a second waveguide; a detector, optically coupled with the second waveguide, configured to detect one or more photons in the second waveguide; an optical switch configured to provide an optical coupling between the first waveguide and the second waveguide when the detector is operational; and an electrical switch electrically coupled to the detector, wherein the electrical switch is configured to change state in response to the detector detecting one or more photons. The photon detecting component further includes readout circuitry configured to determine a state of the electrical switch of the detecting section.

12 Claims, 12 Drawing Sheets

(56) References Cited

U.S. PATENT DOCUMENTS

| | | |
|---|---|---|
| 5,030,614 A | 7/1991 | Hollander et al. |
| 5,030,617 A | 7/1991 | Legge |
| 5,041,880 A | 8/1991 | Nojima et al. |
| 5,051,787 A | 9/1991 | Hasegawa |
| 5,053,383 A | 10/1991 | Short et al. |
| 5,127,928 A | 7/1992 | Farries et al. |
| 5,173,620 A | 12/1992 | Fujimaki et al. |
| 5,219,826 A | 6/1993 | Kapitulnik |
| 5,247,475 A | 9/1993 | Hasunuma et al. |
| 5,321,004 A | 6/1994 | Perez et al. |
| 5,365,476 A | 11/1994 | Mukhanov |
| 5,376,626 A | 12/1994 | Drehman et al. |
| 5,455,519 A | 10/1995 | Ohori |
| 5,481,119 A | 1/1996 | Higashino et al. |
| 5,521,862 A | 5/1996 | Frazier |
| 5,574,290 A | 11/1996 | You |
| 5,719,105 A | 2/1998 | Odagawa et al. |
| 5,825,240 A | 10/1998 | Geis et al. |
| 5,831,278 A | 11/1998 | Berkowitz |
| 5,892,644 A | 4/1999 | Evans |
| 5,925,892 A | 7/1999 | Mizuno et al. |
| 6,029,075 A | 2/2000 | Das et al. |
| 6,078,517 A | 6/2000 | Herr |
| 6,242,939 B1 | 6/2001 | Nagasawa |
| 6,433,974 B2 | 8/2002 | Heismann |
| 6,774,463 B1 | 8/2004 | Chaudhari et al. |
| 6,900,714 B1 | 5/2005 | Huang et al. |
| 7,227,438 B2 | 6/2007 | Song et al. |
| 7,513,765 B2 | 4/2009 | Liao |
| 7,558,030 B2 | 7/2009 | Lee et al. |
| 7,589,323 B2 | 9/2009 | Tanaka et al. |
| 7,724,083 B2 | 5/2010 | Herring et al. |
| 7,847,282 B2 | 12/2010 | Sandhu |
| 7,852,106 B2 | 12/2010 | Herr et al. |
| 8,330,145 B2 | 12/2012 | Wakana et al. |
| 8,565,844 B2 | 10/2013 | Smith |
| 8,577,430 B1 | 11/2013 | Smith |
| 8,736,085 B2 | 5/2014 | Sines |
| 9,293,240 B2 | 3/2016 | Flex-Cable |
| 9,443,576 B1 | 9/2016 | Miller |
| 9,500,519 B2 | 11/2016 | Tang et al. |
| 9,509,315 B2 | 11/2016 | McCaughan et al. |
| 9,853,645 B1 | 12/2017 | Mukhanov et al. |
| 9,876,505 B1 | 1/2018 | Dai et al. |
| 9,954,158 B2 | 4/2018 | You et al. |
| 9,998,122 B2 | 6/2018 | Hamilton et al. |
| 10,103,736 B1 | 10/2018 | Powell et al. |
| 10,133,986 B1 | 11/2018 | Newton et al. |
| 10,171,086 B2 | 1/2019 | McCaughan et al. |
| 10,177,298 B1 | 1/2019 | Taylor et al. |
| 10,186,858 B2 | 1/2019 | Klaus et al. |
| 10,197,440 B2 | 2/2019 | Najafi |
| 10,262,776 B2 | 4/2019 | Choi et al. |
| 10,361,703 B2 | 7/2019 | Najafi |
| 10,386,229 B2 | 8/2019 | Najafi et al. |
| 10,396,733 B2 | 8/2019 | Najafi et al. |
| 10,454,014 B2 | 10/2019 | Najafi et al. |
| 10,454,016 B2 | 10/2019 | Fong et al. |
| 10,566,516 B2 | 2/2020 | Najafi |
| 10,573,800 B1 | 2/2020 | Najafi |
| 10,586,910 B2 | 3/2020 | Najafi |
| 10,620,044 B2 | 4/2020 | Thompson et al. |
| 10,651,325 B2 | 5/2020 | Najafi et al. |
| 10,879,905 B2 | 12/2020 | Najafi et al. |
| 10,897,235 B2 | 1/2021 | Najafi et al. |
| 10,911,031 B2 | 2/2021 | Wise et al. |
| 10,944,403 B2 | 3/2021 | Najafi |
| 10,984,857 B2 | 4/2021 | Najafi |
| 11,009,387 B2 | 5/2021 | Chung et al. |
| 2002/0149453 A1 | 10/2002 | Snitchler et al. |
| 2003/0087503 A1 | 5/2003 | Sakaguchi et al. |
| 2004/0109633 A1* | 6/2004 | Pittman .............. G06N 10/00 385/16 |
| 2005/0153843 A1 | 7/2005 | Kubota |
| 2005/0197254 A1 | 9/2005 | Stasiak et al. |
| 2006/0073979 A1 | 4/2006 | Thieme et al. |
| 2006/0183327 A1 | 8/2006 | Moon |
| 2006/0270224 A1 | 11/2006 | Song et al. |
| 2008/0026234 A1 | 1/2008 | Sambasivan et al. |
| 2008/0197285 A1 | 8/2008 | Frey et al. |
| 2008/0272302 A1 | 11/2008 | Frey et al. |
| 2009/0014433 A1 | 1/2009 | O'Neil et al. |
| 2010/0026447 A1 | 2/2010 | Keefe et al. |
| 2010/0171098 A1 | 7/2010 | Suzuki |
| 2011/0108803 A1 | 5/2011 | Deligianni et al. |
| 2011/0116742 A1 | 5/2011 | Chang et al. |
| 2011/0254053 A1 | 10/2011 | Goupil et al. |
| 2013/0012392 A1 | 1/2013 | Tanaka et al. |
| 2013/0090244 A1 | 4/2013 | Shinzato et al. |
| 2013/0124112 A1 | 5/2013 | Heath et al. |
| 2013/0143744 A1 | 6/2013 | Marsili et al. |
| 2013/0341594 A1 | 12/2013 | Mohseni et al. |
| 2014/0113828 A1 | 4/2014 | Gilbert et al. |
| 2014/0299751 A1 | 10/2014 | Tang et al. |
| 2015/0018218 A1 | 1/2015 | Lakrimi et al. |
| 2015/0179916 A1 | 6/2015 | Pramanik et al. |
| 2015/0348681 A1 | 12/2015 | Huh |
| 2016/0028402 A1 | 1/2016 | McCaughan et al. |
| 2016/0028403 A1 | 1/2016 | McCughan et al. |
| 2016/0356708 A1 | 12/2016 | Bennett et al. |
| 2017/0186933 A1 | 6/2017 | Sunter et al. |
| 2018/0033944 A1 | 2/2018 | Ladizinsky et al. |
| 2018/0145664 A1 | 5/2018 | Herr et al. |
| 2018/0335343 A1 | 11/2018 | Najafi et al. |
| 2018/0364097 A1 | 12/2018 | Najafi |
| 2018/0374979 A1 | 12/2018 | Nozawa |
| 2019/0027672 A1 | 1/2019 | Megrant |
| 2019/0035904 A1 | 1/2019 | Najafi |
| 2019/0035999 A1 | 1/2019 | Najafi |
| 2019/0109595 A1 | 4/2019 | Najafi |
| 2019/0148848 A1 | 5/2019 | Najafi et al. |
| 2019/0227230 A1 | 7/2019 | Novack et al. |
| 2019/0288132 A1 | 9/2019 | Wang et al. |
| 2020/0066962 A1 | 2/2020 | Najafi |
| 2020/0080890 A1 | 3/2020 | Najafi et al. |
| 2020/0111944 A1 | 4/2020 | Moodera et al. |
| 2020/0194656 A1 | 6/2020 | Najafi |
| 2020/0256722 A1 | 8/2020 | Najafi et al. |
| 2021/0183767 A1 | 6/2021 | Najafi et al. |
| 2021/0239518 A1 | 8/2021 | Chung et al. |

FOREIGN PATENT DOCUMENTS

| | | |
|---|---|---|
| DE | 2440576 B1 | 1/1976 |
| DE | 19714191 C1 | 7/1998 |
| EP | 0299879 A2 | 1/1989 |
| EP | 1965184 A1 | 9/2008 |
| GB | 2530500 A | 3/2016 |
| JP | S63299282 A | 12/1988 |
| JP | H05-55647 A | 3/1993 |
| WO | WO90/14715 A1 | 11/1990 |
| WO | WO94/09566 A1 | 4/1994 |
| WO | WO/2012052628 A1 | 4/2012 |

OTHER PUBLICATIONS

Psiquantum, International Search Report and Written Opinion, PCT/US2019/016885, dated Apr. 24, 2019, 9 pgs.

Thompson, Non-Final Office Action, U.S. Appl. No. 16/450,911, dated Aug. 2, 2019, 6 pgs.

Thompson, Notice of Allowance, U.S. Appl. No. 16/450,911, dated Dec. 11, 2019, 5 pgs.

Thompson, Non-Final Office Action, U.S. Appl. No. 16/985,137, dated Sep. 30, 2021, 6 pgs.

Najafi, Notice of Allowance, U.S. Appl. No. 16/046,807, dated Oct. 29, 2019, 7 pgs.

Najafi, Notice of Allowance, U.S. Appl. No. 16/136,124, dated Apr. 4, 2019, 8 pgs.

Najafi, Notice of Allowance, U.S. Appl. No. 16/136,124, dated Jun. 27, 2019, 8 pgs.

Najafi, Corrected Notice of Allowance, U.S. Appl. No. 16/136,124, dated Sep. 23, 2019, 2 pgs.

(56) References Cited

OTHER PUBLICATIONS

Psiquantum Corp., International Search Report and Written Opinion, PCT/US2018/060802, dated Apr. 8, 2019, 6 pgs.
Psiquantum, International Preliminary Report on Patentability, PCT/US2018/060802, dated May 19, 2020, 13 pgs.
Najafi, Notice of Allowance, U.S. Appl. No. 16/773,921, dated Sep. 22, 2021, 8 pgs.
Najafi, Notice of Allowance, U.S. Appl. No. 17/195,522, dated Nov. 16, 2021, 2 pgs.
Najafi, Notice of Allowance, U.S. Appl. No. 16/773,921, dated Nov. 15, 2021, 8 pgs.
Najafi, Non-Final Office Action, U.S. Appl. No. 16/813,628, dated Mar. 7, 2022, 7 pgs.
Najafi, Notice of Allowance, U.S. Appl. No. 17/033,337, dated Feb. 25, 2022, 7 pgs.
Akhlaghi et al., "Gated Mode Superconducting Nanowire Single Photon Detectors," Optics Express, vol. 20, No. 2, Jan. 16, 2012, 9 pgs.
Atikian, Haig A. et al., "Superconducting Nanowire Single Photon Detector on Diamond," arXiv:1401.4490v1, physics.optics, Jan. 17, 2014, 5 pgs.
Cheng, Risheng et al., "Photon-Number-Resolving Detector Based on Superconducting Serial Nanowires," IEEE Transactions on Applied Superconductivity, vol. 23, No. 1, Feb. 2013, 9 pgs.
Clem, John R. et al., "Geometry-dependent critical currents in superconducting nanocircuits," arXiv:1109.4881v1 [cond-mat.supr-con] Sep. 22, 2011, 29 pgs.
Dai, Daoxin et al., "Mode conversion in tapered submicron silicon ridge optical waveguides," Optics Express, vol. 20, No. 12, Jun. 4, 2012, 15 pgs.
Henrich, D. et al., "Geometry-inducted reduction of the critical current in superconducting nanowires," arXiv: 1204.0616v2 [cond-mat-supr-con] Aug. 22, 2012, 6 pgs.
Hortensius, H.L. et al., "Critical-Current Reduction in Thin Superconducting Wires Due to Current Crowding," arXiv:1203.4253v3, [cond-mat-supr-con], May 6, 2012, 5 pgs.
Korzh, B.A. et al., "Demonstrating sub-3 ps temporal resolution in a superconducting nanowire single-photon detector," Apr. 18, 2018, 26 pgs.
Lee, S.-B. et al., "Fabrication of a self-aligned superconducting nanotransistor based NOR logic gate," Microelectronic Engineering 57-58, 2001, 7 pgs., downloaded from https://www.sciencedirect.com/science/article/abs/pii/S0167931701004269).
Marsili, F., "Single-photon detectors based on ultra-narrow superconducting nanowires," Massachusetts Institute of Technology, Department of Electrical Engineering and Computer Science, Dec. 19, 2010, 31 pgs.
Mattioli, Francesco et al., "Photon-number-resolving superconducting nanowire detectors," Superconductor Science and Technology, Aug. 24, 2015, 16 pgs.
McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosopy in Electrical Engineering, 22 pgs.
Murphy et al., "Nanoscale superconducting memory based on the kinetic inductance of asymmetric nanowire loops," Departmwent of Physics, University of Illinois at Urbana-Champaign, arXiv: 1701.08715v2 [cond-mat.supr-con] Jun. 29, 2017, 19 pgs.
Natarajan et al., "Superconducting nanowire single-photon detectors: physics and applications", 2012, Superconduc. Sci. Technology vol. 25, p. 063001.
Quaranta et al., Superconductive Three-Terminal Amplifier/Discriminator, IEEE Transactions on Applied Superconductivity, vol. 19, No. 3, Jun. 2, 2009, 4 pgs.
Schmidt, E. et al., AIN-Buffered Superconducting NbN Nanowire Single-Photon Detector on GaAs, IEEE Transactions on Applied Superconductivity, vol. 27, No. 4, Jun. 2017, 5 pgs.
Shiino, Tatsuya et al., "Improvement of Critical Temperature of Superconducting NbTiN and NbN Thin Films Using the AIN Buffer Layer," Superconductor Science and Technology, Mar. 2010, 11 pgs.
Zhao, Qing-Yuan et al., "A compact superconducting nanowire memory element operated by nanowire cryotrons," Massachusetts Institute of Technology, Department of Electrical Engineering and Computer Science, Nov. 22, 2017, 20 pgs.
PsiQuantum Corp., International Search Report and Written Opinion, PCT/US2018/033042, dated Aug. 28, 2018, 13 pgs.
PsiQuantum Corp., International Search Report and Written Opinion, PCT/US2018/033041, dated Jul. 27, 2018, 16 pgs.
PsiQuantum Corp., International Search Report and Written Opinion, PCT/US2018/044091, dated Nov. 7, 2018, 13 pgs.
PsiQuantum Corp., Invitation to Pay Additional Fees/Partial Search Report, PCT/US2018/037892, dated Aug. 20, 2018, 12 pgs.
PsiQuantum Corp., Invitation to Pay Additional Fees/Partial Search Report, PCT/US2018/054414, dated Jan. 24, 2019, 21 pgs.
PsiQuantum Corp., International Search Report and Written Opinion, PCT/US2018/054414, dated Mar. 20, 2019, 21 pgs.
Najafi, Office Action dated Dec. 12, 2018, U.S. Appl. No. 16/028,288, 6 pgs.
Najafi, Notice of Allowance dated Apr. 5, 2019, U.S. Appl. No. 16/028,288, 10 pgs.
Najafi, Office Action dated Sep. 21, 2018, U.S. Appl. No. 16/028,293, 8 pgs.
Najafi, Final Office Action dated Mar. 1, 2019 U.S. Appl. No. 16/028,293, 5 pgs.
Najafi, Notice of Allowance dated Sep. 21, 2018, U.S. Appl. No. 16/012,520, 9 pgs.
Najafi, Office Action, U.S. Appl. No. 16/136,124, dated Apr. 4, 2019, 9 pgs.
Najafi, Quayle Office Action, U.S. Appl. No. 16/151,180, dated Jan. 31, 2019, 5pgs.
Najafi, Notice of Allowace, U.S. Appl. No. 16/151,180, dated Mar. 14, 2019, 5 pgs.
Najafi, Notice of Allowance U.S. Appl. No. 16/151,190, dated Feb. 6, 2019, 11 pgs.
Najafi, Notice of Allowance U.S. Appl. No. 16/151,190, dated dated Mar. 28, 2019, 5 pgs.
Najafi, Office Action, U.S. Appl. No. 16/046,815, dated Feb. 4, 2019, 9 pgs.
Najafi, Office Action, U.S. Appl. No. 16/046,807, dated Mar. 18, 2019, 10 pgs.
Najafi, Office Action, U.S. Appl. No. 16/107,143, dated Mar. 19, 2019, 11 pgs.
Psiquantum Corp., International Search Report and Written Opinion, PCT/US2019/017687, dated Apr. 30, 2019, 8 pgs.
Stanfield, CMOS-Compatible, Piezo-Optomechanically Tunable Photonics for Visible Wavelengths and Cryogenic, Temperatures, vol. 27, Issue 20, pp. 28588-28605, 2019.
Psiquantum Corp., International Search Report, PCT/US2019/017691, dated Apr. 23, 2019, 7pgs.
Psiquantum Corp., International Search Report and Written Opinion, PCT/US2019/030019, dated Jul. 17, 2019, 8 pgs.
Psiquantum Corp., PCT/US2018/044091, International Preliminary Report on Patentability, dated Jan. 28, 2020, 6 pgs.
Najafi, Non-Final Office Action, U.S. Appl. No. 16/664,716, dated Apr. 1, 2020, 14 pgs.
Psiquantum, International Search Report / Written Opinion, PCT/US2019/051853, dated Jan. 27, 2020, 13 pgs.
Mohsen K. Akhlaghi et al., Gated Mode Superconducting Nanowire Single Photon Detectors, vol. 20, No. 2, Jan. 16, 2012, ISSN 1094-4087, 9 pgs.
Psiquantum, International Preliminary Report on Patentability, PCT/US12018/033041, dated Nov. 26, 2019, 8 pgs.
Psiquantum, International Preliminary Report on Patentability, PCT/US2018/054414, dated Apr. 8, 2020, 15 pgs.
Psiquantum, International Search Report / Written Opinion, PCT/US2018/037892, dated Oct. 17, 2018, 18 pgs.
Psiquantum, International Preliminary Report on Patentability, PCT/US2018/037892, dated Dec. 17, 2019, 12 pgs.

(56) References Cited

OTHER PUBLICATIONS

Najafi, Non-Final Office Action, U.S. Appl. No. 16/553,068, dated Apr. 1, 2020, 11 pgs.
Najafi, Non-Final Office Action, U.S. Appl. No. 16/544,718, dated Aug. 17, 2020, 6 pgs.
Najafi, Non-Final Office Action, U.S. Appl. No. 16/656,506, dated Aug. 13, 2020, 18 pgs.
Najafi, Notice of Allowance, U.S. Appl. No. 16/553,068, dated Sep. 18, 2020, 8 pgs.
Najafi, Notice of Allowance, U.S. Appl. No. 16/473,550, dated Sep. 24, 2020, 8 pgs.
Najafi, Notice of Allowance, U.S. Appl. No. 16/473,550, dated Nov. 3, 2020, 2 pgs.
Najafi, Notice of Allowance, U.S. Appl. No. 16/553,068, dated Nov. 12, 2020, 2 pgs.
Najafi, Notice of Allowance, U.S. Appl. No. 16/656,506, dated Nov. 3, 2020, 12 pgs.
Najafi, Final Office Action, U.S. Appl. No. 16/664,716, dated Oct. 16, 2020, 14 pgs.
Najafi, Non-Final Office Action, U.S. Appl. No. 17/135,861, dated Sep. 23, 2021, 6 pgs.
Psiquantum Corp., Notice of Allowance, U.S. Appl. No. 16/849,829, dated Mar. 1, 2021, 8 pgs.
Psiquantum Corp., Notice of Allowance, U.S. Appl. No. 16/544,718, dated Feb. 5, 2021, 6 pgs.
Najafi, Notice of Allowance, U.S. Appl. No. 16/840,166, dated Jul. 21, 2021, 2 pgs.
Najafi, Notice of Allowance, U.S. Appl. No. 17/135,861, dated Jan. 28, 2022, 7 pgs.
Thompson, Non-Final Office Action, U.S. Appl. No. 16/985,137, dated Jan. 18, 2022, 8 pgs.
Psiquantum Corp., Notice of Allowance, U.S. Appl. No. 16/544,718, dated Mar. 24, 2021, 2 pgs.
Psiquantum Corp., Notice of Allowance, U.S. Appl. No. 16/849,829, dated Apr. 5, 2021, 2 pgs.
Psiquantum Corp., Notice of Allowance, U.S. Appl. No. 16/664,716, dated Jan. 28, 2021, 8 pgs.
Psiquantum Corp., Notice of Allowance, U.S. Appl. No. 16/473,547, dated Jan. 27, 2021, 2 pgs.
Psiquantum Corp., Notice of Allowance, U.S. Appl. No. 16/543,256, dated Feb. 4, 2021, 2 pgs.
Psiquantum Corp., Notice of Allowance, U.S. Appl. No. 16/544,718, dated Mar. 12, 2021, 2 pgs.
Najafi, Notice of Allowance, U.S. Appl. No. 16/473,547, dated Dec. 9, 2020, 8 pgs.
Najafi, Notice of Allowance, U.S. Appl. No. 16/543,256, dated Dec. 9, 2020, 12 pgs.
Chung, Non-Final Office Action, U.S. Appl. No. 16/849,829, dated Aug. 21, 2020, 5 pgs.
Chung, Notice of Allowance, U.S. Appl. No. 16/849,829, dated Dec. 8, 2022, 5 pgs.
Psiquantum Corp., International Search Report / Written Opinion, PCT/US20/28519, dated Jan. 12, 2021, 9 pgs.
Najafi, Notice of Allowance, U.S. Appl. No. 16/623,503, dated Feb. 22, 2022, 10 pgs.
Najafi, Notice of Allowance, U.S. Appl. No. 17/195,522, dated Feb. 9, 2022, 2 pgs.
Najafi, Notice of Allowance, U.S. Appl. No. 17/135,861, dated Feb. 15, 2022, 2 pgs.
Najafi, Notice of Allowance, U.S. Appl. No. 16/773,921, dated Feb. 16, 2022, 2 pgs.
Najafi, Notice of Allowance, U.S. Appl. No. 17/195,522, dated Nov. 12, 2021, 8 pgs.
Psiquantum, Notice of Allowance, U.S. Appl. No. 16/840,166, dated Mar. 23, 2021, 7 pgs.
Psiquantum, Notice of Allowance, U.S. Appl. No. 16/544,718, dated Apr. 26, 2021, 2 pgs.
Psiquantum, Notice of Allowance, U.S. Appl. No. 16/664,716, dated Apr. 21, 2021, 8 pgs.
Psiquantum, Notice of Allowance, U.S. Appl. No. 16/664,716, dated May 7, 2021, 2 pgs.
Psiquantum, Notice of Allowance, U.S. Appl. No. 16/543,256, dated Mar. 24, 2021, 2 pgs.
Psiquantum, Notice of Allowance, U.S. Appl. No. 16/575,274, dated Apr. 22, 2021, 10 pgs.
Psiquantum, International Preliminary Reporton Patentability, PCT/US2018/033042, dated Nov. 19, 2019, 7 pgs.
Psiquantum, International Search Report, PCT/US2018/033041, dated Jul. 27, 2018, 12 pgs.
Psiquantum, International Preliminary Report on Patentability, PCT/US2019/051853, Mar. 23, 2021, 10 pgs.
Psiquantum, International Preliminary Report on Patentability, PCT/US2019/017687, dated Aug. 18, 2020, 6 pgs.
Psiquantum, International Preliminary Report on Patentability, PCT/US2019/030019, dated Nov. 3, 2020, 7 pgs.
Najafi, Notice of Allowance, U.S. Appl. No. 17/033,337, dated Dec. 9, 2021, 8 pgs.
McCaughan, A.N., et al., "Using Geometry to Sense Current," Nano Letters 16 (2016), 6 pgs.
Chung, Non-Final Office Action, U.S. Appl. No. 17/232,086, dated Dec. 16, 2021, 6 pgs.
Najafi, Notice of Allowance, U.S. Appl. No. 17/195,522, dated Dec. 9, 2021, 2 pgs.
Najafi, Notice of Allowance, U.S. Appl. No. 16/773,921, dated Dec. 24, 2021, 2 pgs.
Najafi, Notice of Allowance, U.S. Appl. No. 17/195,522, dated Jan. 7, 2022, 2 pgs.
Psiquantum, Notice of Allowance, U.S. Appl. No. 16/840,166, dated May 24, 2021, 5 pgs.
Najafi, Non-Final Office Action, U.S. Appl. No. 16/623,503, dated Jun. 23, 2021, 15 pgs.
Stanfield, CMOS-Compatible, Piezo-Optomechanically Tunable Photonics for Visible Wavelengths and Cryogenic Temperatures, Optics Express, vol. 27, Issue 20, pp. 28588-28605, 2019, 18 pgs.

* cited by examiner

SELF-TRIAGING PHOTON DETECTOR

RELATED AND PRIORITY APPLICATIONS

The application claims priority to U.S. Provisional Patent Application No. 62/924,142, entitled "Self-Triaging Photon Detector," filed Oct. 21, 2019, which is hereby incorporated by reference in its entirety.

This application also relates to U.S. patent application Ser. No. 16/136,124, entitled "Methods and Devices for Impedance Multiplication," filed Sep. 19, 2018, now U.S. Pat. No. 10,461,445, and U.S. patent application Ser. No. 16/107,143, entitled "Superconductor-to-Insulator Devices," filed Aug. 21, 2018, now U.S. Pat. No. 10,573,800, each of which is incorporated by reference in its entirety.

TECHNICAL FIELD

This relates generally to photon detectors, including but not limited to, superconducting photon detectors.

BACKGROUND

Photon detectors are essential components in many electronic devices. Ultra-sensitive photon detectors that are capable of detecting a small number of photons, such as individual photons (e.g., single photons), are used in a variety of applications, such as optical communications, medical diagnostics, and space research. One such use of ultra-sensitive photon detectors is for optical quantum information applications.

Superconductors are materials capable of operating in a superconducting state with zero electrical resistance under particular conditions. Because of many useful properties of superconductors, photon detectors based on superconductors are expected to have superior performance over conventional photon detectors.

SUMMARY

There is a need for systems and/or devices with more efficient and effective methods for detecting photons. Such systems, devices, and methods optionally complement or replace conventional systems, devices, and methods for detecting photons.

In some embodiments, a photon detecting component is provided. The photon detecting component includes a first waveguide and a detecting section. The detecting section includes a second waveguide; a detector, optically coupled with the second waveguide, configured to detect one or more photons in the second waveguide; an optical switch configured to provide an optical coupling between the first waveguide and the second waveguide when the detector is operational; and an electrical switch electrically coupled to the detector, wherein the electrical switch is configured to change state in response to the detector detecting one or more photons. The photon detecting component further includes readout circuitry configured to determine a state of the electrical switch of the detecting section.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

As used herein, a "superconducting circuit," "superconductor circuit," or "superconducting component" is a circuit (or component) having one or more superconducting materials. For example, a superconducting photodetector circuit is a photodetector circuit that includes one or more superconducting materials. As used herein, a "superconducting" material is a material that is capable of operating in a superconducting state (under particular conditions). For example, a superconducting material operates as a superconductor (e.g., operates with zero electrical resistance) when cooled below a particular temperature (e.g., a critical temperature) and having less than a threshold current flowing through it. A superconducting material is also called herein a superconduction-capable material. In some embodiments, the superconducting materials operate in a non-superconducting state during which the materials have a non-zero electrical resistance (e.g., a resistance in the range of one thousand to ten thousand ohms). For example, a superconducting material supplied with a current greater than a threshold current for the superconducting material may transition from a superconducting state with zero electrical resistance to a non-superconducting state with non-zero electrical resistance.

Figure 1:
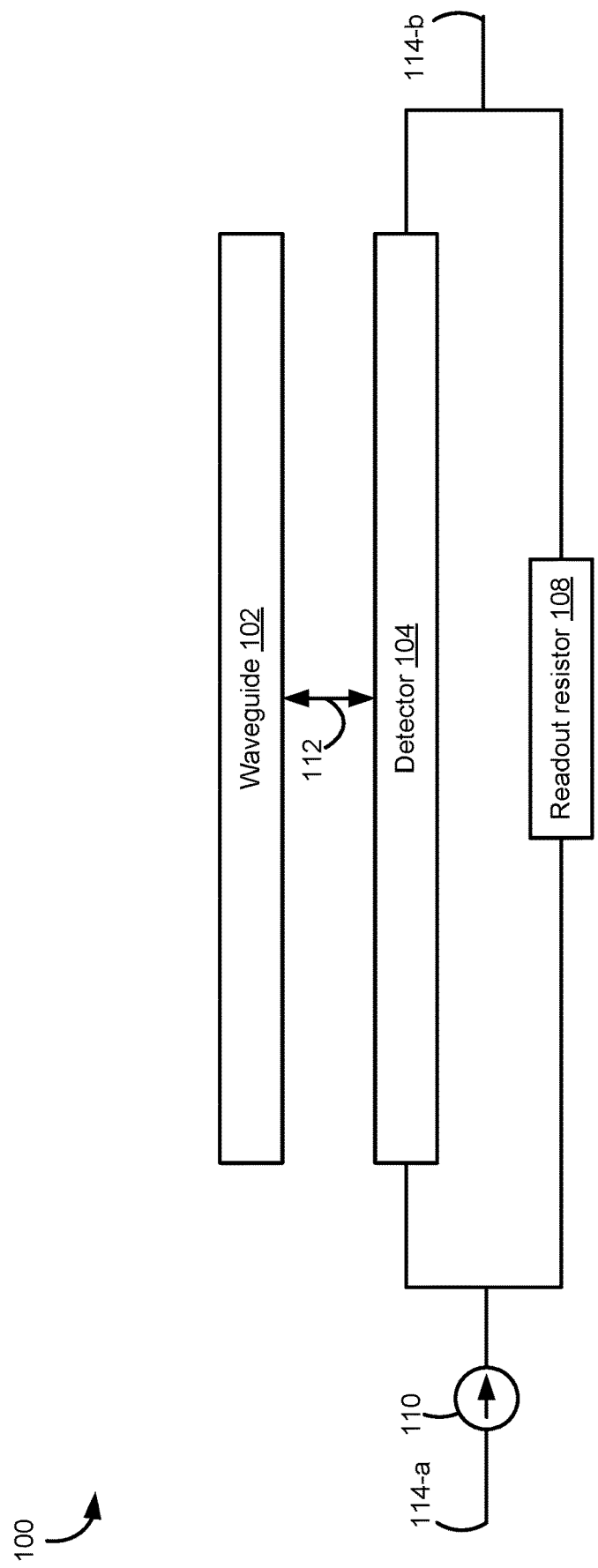
FIG. 1 is a schematic diagram illustrating a photon detector, in accordance with some embodiments.

FIG. 1 is a schematic diagram illustrating a photon detecting component 100, in accordance with some embodiments. Photon detecting component 100 includes a waveguide 102, a detector 104 (e.g., a photon detector), and a readout resistor 108. Photon detecting component 100 is optically coupled to the detector 104 by an optical coupling 112. For example, in some embodiments, waveguide 102 and detector 104 are integrated on the same substrate. In some embodiments, waveguide 102 and detector 104 are adjacent (e.g., vertically or horizontally with respect to the substrate) such that a photon in waveguide 102 can transfer to (e.g., impinge on) detector 104. In some embodiments, detector 104 is directly above or below waveguide 102, and the optical coupling is simply the interface between the two layers. In some embodiments, the photon detecting component 100 includes one or more optical interface layers (comprising the coupling) that separate the two layers (e.g., either horizontally or vertically with respect to the substrate). The detector 104 is thus configured to detect photons traveling along waveguide 102.

In some embodiments, photon detecting component 100 includes a current source 110, while in some other embodiments photon detecting component 100 is coupled to current source 110. In some embodiments, detector 104 is or includes a first superconducting component. In some embodiment, in operation, the photon detecting component 100 is cooled below a critical temperature of the first superconducting component such that, absent detection of a photon, the first superconducting component is maintained in a superconducting state (e.g., with zero electrical resistance). Thus, absent detection of a photon, a voltage between a first terminal 114-a of the photon detecting component 100 and a second terminal 114-b of the photon detecting component 100 is zero or nearly zero (e.g., because the first superconducting component is in parallel with the readout resistor 108, and the first superconducting component has zero resistance, none or almost none of the current from current source 110 is routed to the readout resistor 108).

Further, in some embodiments, the first superconducting component is configured to transition from a superconducting state to a non-superconducting state in response to detecting one or more photons. For example, the first superconducting component is biased by a current source 110 such that a single photon impinging on the first superconducting component is sufficient to transition the first superconducting component from the superconducting state to a non-superconducting state (e.g., a resistive state or an insulating state). For example, in some embodiments, the current source 110 is configured to supply a current (e.g., a bias current) that is below a threshold current for the first superconducting component (e.g., 70%, 80%, or 90% of the threshold current for the first superconducting component).

In some instances, when a photon (e.g., a single photon) is incident on the first superconducting component, the photon creates a hotspot that reduces the maximum superconducting current density, and thus the corresponding maximum superconducting current (also called the maximum current for superconduction), in the first superconducting component. The maximum current for superconduction in the first superconducting component in the presence of a hotspot is referred to herein as the hotspot current for the first superconducting component. In some embodiments, the current supplied by current source 110 is above the hotspot current for the first superconducting component but below the threshold current for the first superconducting component.

Thus, when a photon traveling along waveguide 102 impinges on detector 104 through optical coupling 112, the first superconducting component becomes non-superconducting. When this happens, at least a portion of the current from current source 110 is routed to readout resistor 108, resulting in a non-zero voltage between the first terminal 114-a of the photon detecting component 100 and the second terminal 114-b of the photon detecting component. This non-zero voltage can be interpreted as detection of a photon by appropriate readout circuitry.

Figure 2:
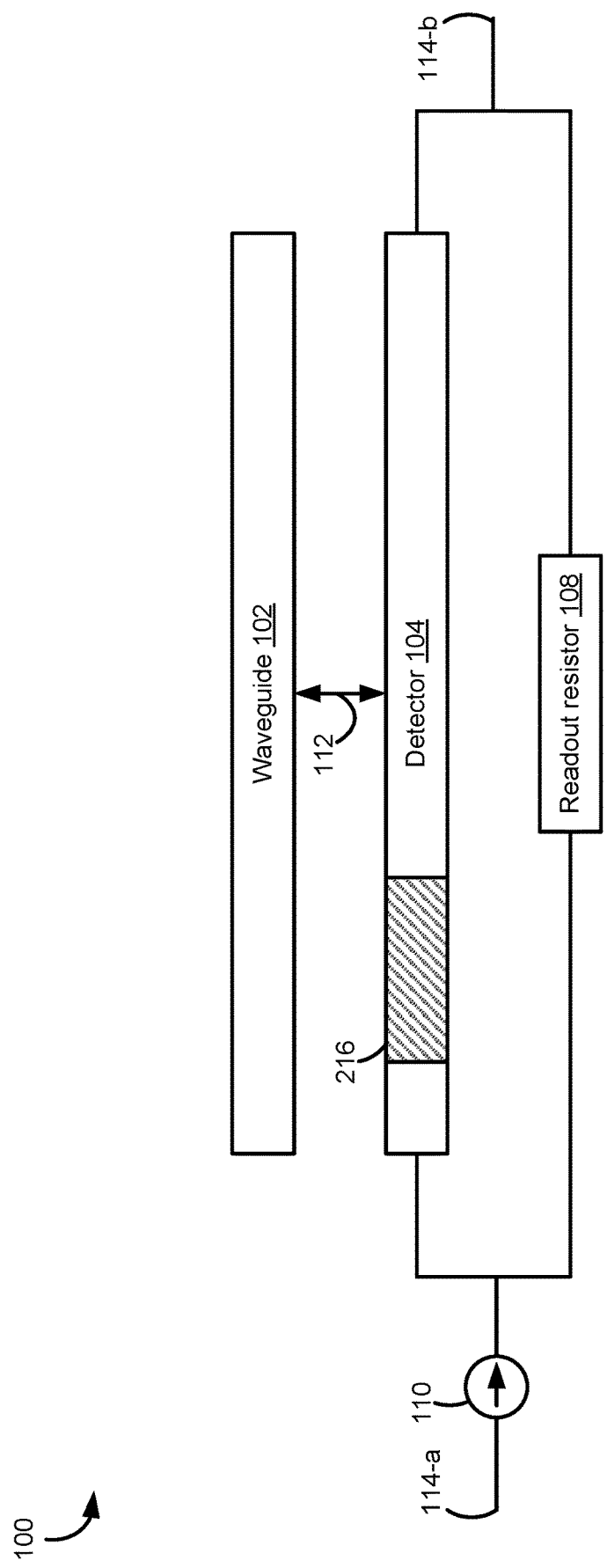
FIG. 2 is a schematic diagram illustrating a photon detector with a defect, in accordance with some embodiments.

FIG. 2 is a schematic diagram illustrating the photon detecting component 100 with a defect 216 in detector 104, in accordance with some embodiments. For example, as noted above, in some embodiments, detector 104 is or includes a first superconducting component. In some circumstances, defect 216 may be a persistent defect (a manufacturing or a wear defect) that causes a portion of the first superconducting component to fail to super-conduct under operating conditions (e.g., lowers the threshold current below the bias current provided by current source 110). In this situation, the voltage between the first terminal 114-a of the photon detecting component 100 and the second terminal 114-b of the photon detecting component is non-zero even in the absence of a detected photon, making it difficult or impossible to determine if a photon has been detected. Thus, the photon detecting component 100 shown in FIG. 2 is not operational. Further, even though the photon detecting component 100 shown in FIG. 2 is not operational (e.g., detection of a photon cannot be registered), detector 104 is still coupled to waveguide 102 via optical coupling 112. Thus, photon detecting component 100 still "consumes" photons even when non-operational, introducing errors and damaging the efficiency of the photon detection system.

Some embodiments described with reference to the remaining figures address the disadvantages in photon detecting component 100 by splitting the photon detecting component 100 into a plurality of detecting sections (e.g., arranged in series). Thus, even if some of the detecting sections are non-operational, the photon detecting components and detectors described below are still able to detect photons using the remaining detecting sections. Further, non-operational detecting sections (e.g., detecting sections with defects such as defect 216) are optically-decoupled from the waveguide (e.g., using an optical switch), thus mitigating or eliminating photon losses from non-operational detectors.

Figure 3:
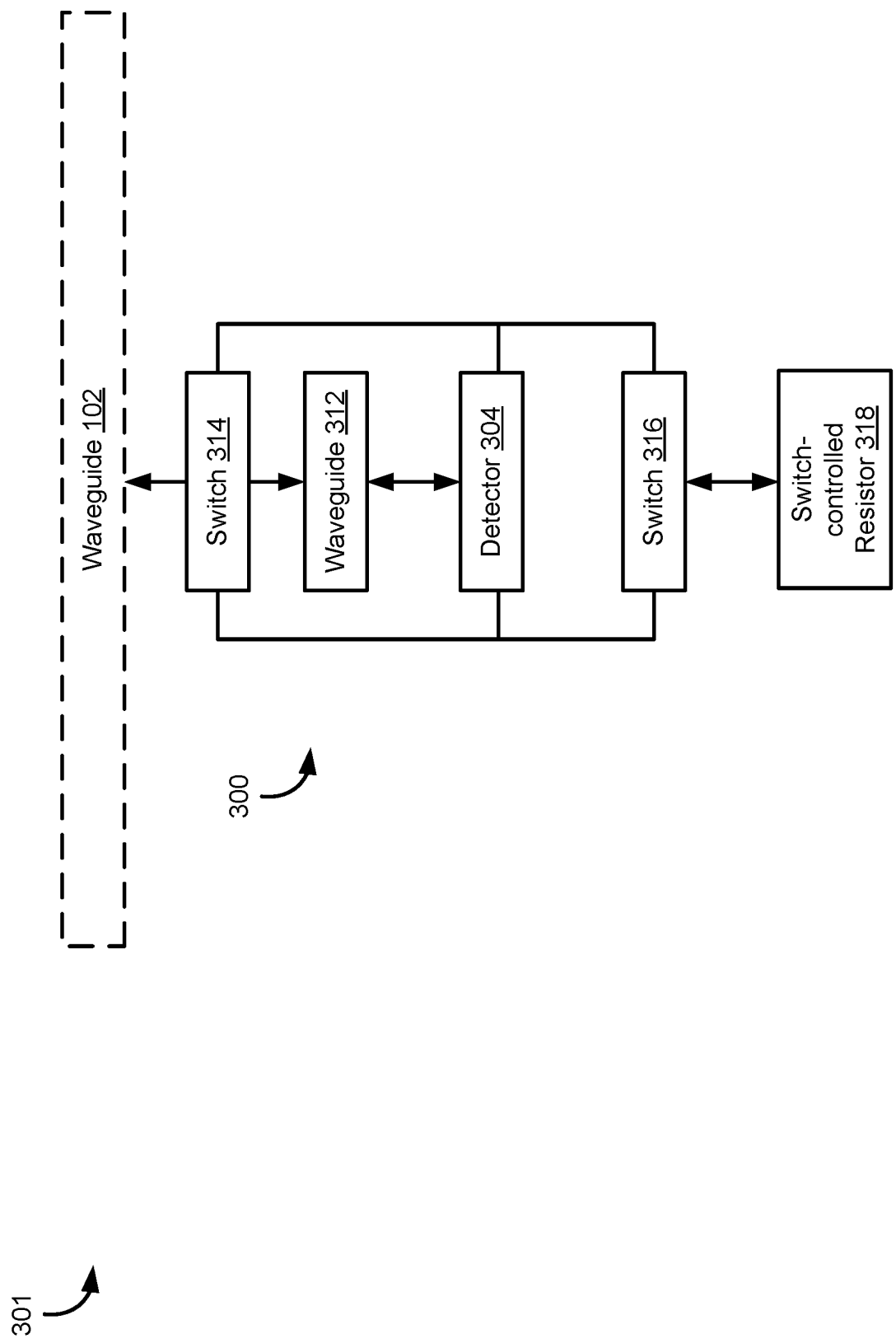
FIG. 3 is a schematic diagram of a photon detecting component, in accordance with some embodiments.

FIG. 3 is a schematic diagram of a photon detecting component 301, in accordance with some embodiments. The photon detecting component 301 includes a detecting section 300. In some embodiments, the detecting section 300 is coupled to waveguide 102 (analogous to waveguide 102, FIGS. 1-2).

Detecting section 300 includes a waveguide 312 (separate and distinct from waveguide 102) and a detector 304. For example, in some embodiments, waveguide 102 and waveguide 312 are separate waveguides fabricated on (e.g. integrated on) the same substrate (e.g., same chip). In some embodiments, waveguide 102 and waveguide 312 are distinct instances of a common set of one or more layers deposited on the substrate (e.g., and subsequently patterned to form waveguide 102 and waveguide 312).

Detecting section 300 includes a detector 304 that is optically coupled with the waveguide 312. For example, in some embodiments, waveguide 312 and detector 304 are integrated on the same substrate. In some embodiments, waveguide 312 and detector 304 are adjacent (e.g., vertically or horizontally with respect to the substrate) such that a photon in waveguide 312 can transfer to (e.g., impinge on) detector 304. In some embodiments, detector 304 is directly above or below waveguide 312, and the optical coupling is simply the interface between the two layers. In some embodiments, the photon detecting section 300 includes one or more optical interface layers (comprising the coupling) that separate the two layers (e.g., either horizontally or vertically with respect to the substrate).

In some embodiments, the detector 304 is strongly optically coupled with the waveguide 312 (e.g., such that there is a nearly 100% probability, such as a 90% or 99% probability, that a photon in waveguide 312 impinges on the detector 304).

The detector 304 is configured to detect one or more photons in the waveguide 312. For example, detector 304 is or includes a first superconducting component, analogous to the first superconducting component described above with reference to photon detecting component 100 shown in FIGS. 1-2. That is, in use, the first superconducting component is biased by a current source (not shown) such that a single photon impinging the first superconducting component causes the first superconducting component to transition from a superconducting state to a non-superconducting state.

Figure 11A:
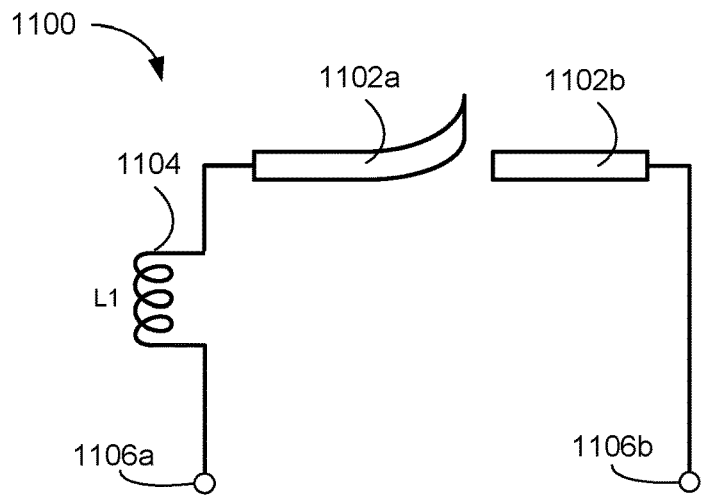
FIGS. 11A-11C are schematic diagrams of a micromechanical optical switch (e.g., a micro-opto-electro-mechanical (MOEMS) switch), in accordance with some embodiments.
Figure 11B:
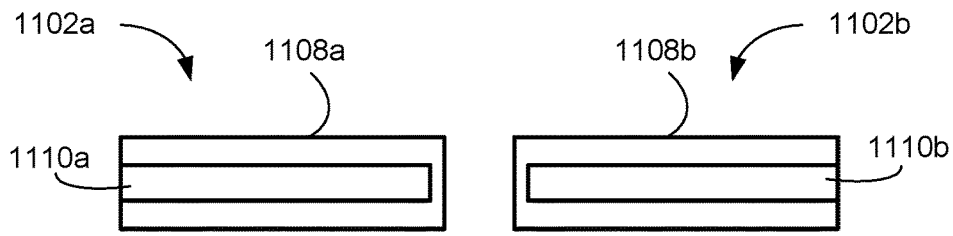

The detecting section 300 further includes an optical switch 314 configured to provide an optical coupling between waveguide 102 and waveguide 312 when the optical switch 314 is in an "on" state (e.g., and little or no optical coupling when the optical switch 314 is in an "off" state). In some embodiments, the optical switch 314 is arranged to automatically be in an "on" state when the detector 304 is operational. For example, when detector 304 is operational, optical switch 314 turns on the optical coupling between waveguide 102 and waveguide 312; and when detector 304 is not operational, optical switch 314 turns off the optical coupling between waveguide 102 and waveguide 312). In some embodiments, the optical coupling provided by optical switch 314 (e.g., when the detector 304 is operational) is a weak optical coupling (e.g., such that there is less than a 50% probability, 20% probability, 10% probability, or 1% probability, that a photon in waveguide 102 is transferred to waveguide 312). In some embodiments, optical switch 314 is implemented using one or more micromechanical optical switches such as MOEMS (micro-opto-electro-mechanical systems) switches, having a state controlled by detector 304. For example, in some embodiments, optical switch 314 is implemented or embodied as MOEMS switch 1100 (FIGS. 11A-11B).

The detecting section 300 further includes an electrical switch 316 electrically coupled to the detector (e.g., in parallel with detector 304). The electrical switch 316 is configured to change state in response to the detector 304 detecting one or more photons. For example, in response to the detector 304 detecting one or more photons, the electrical switch 316 changes from a "closed" (or "on") state, in which switch-controlled resistor 318 has a first (e.g., low) impedance, to an "open" (or "off") state, in which switch-controlled resistor 318 has a second (e.g., high) impedance that is greater than the first impedance.

Figure 4:
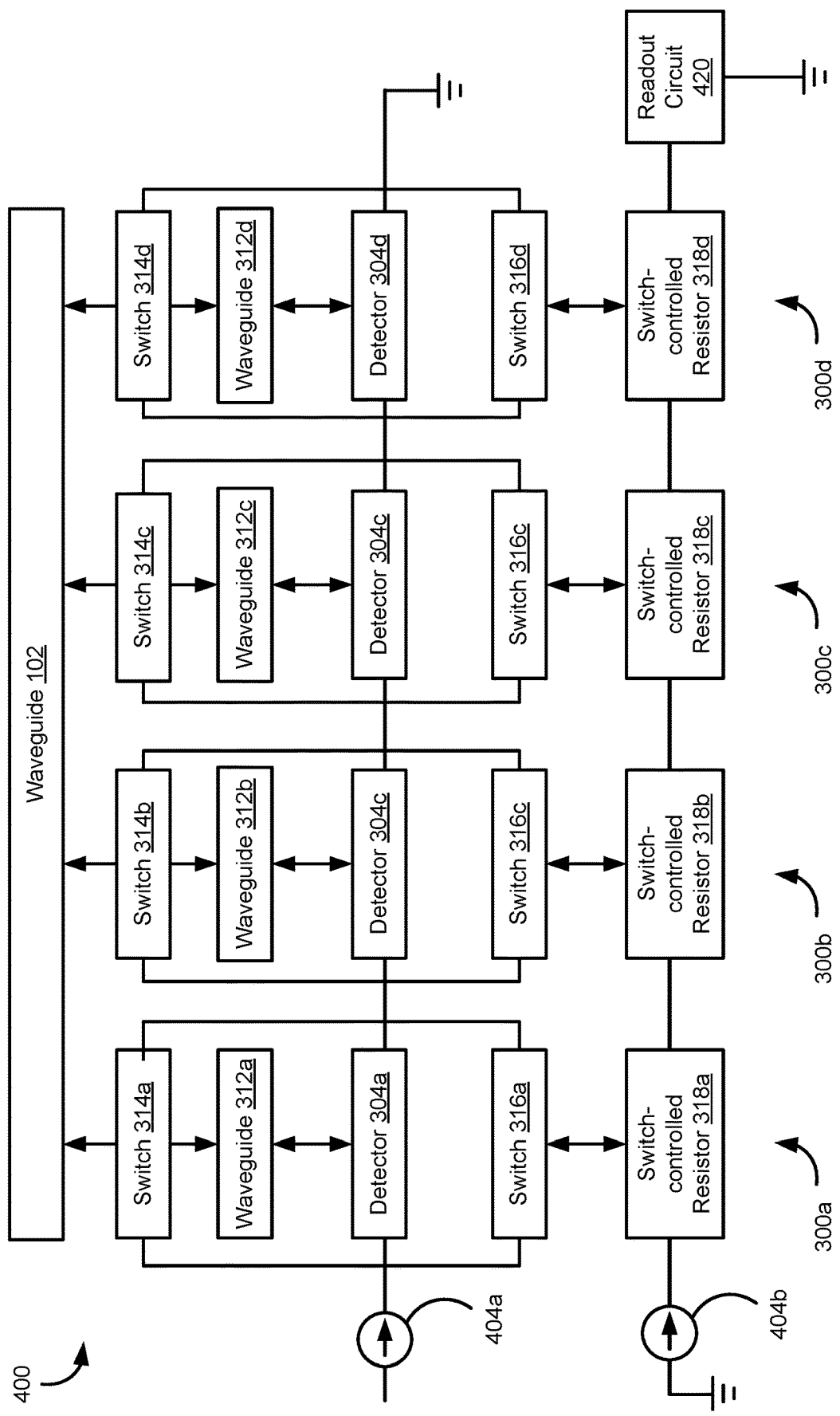
FIG. 4 is a schematic diagram of a photon detector that includes a plurality of photon detecting sections, as shown in FIG. 3, in accordance with some embodiments.

The detecting section 300 is read out by readout circuitry (e.g., as shown in FIG. 4) that is configured to determine a state of the electrical switch 316 of the detecting section (e.g., determine whether the electrical switch 316 is in an open or closed state). For example, the readout circuitry determines the state of the electrical switch 316 by determining whether the switch-controlled resistor 318 has a low impedance (e.g., the first impedance) or a high impedance (e.g., the second impedance). Alternatively, the readout circuitry can be said to reflect the state of electrical switch 316, or to have a state that indicates a state of electrical switch 316.

In some embodiments, the optical switch 314 and the electrical switch 316 are connected in parallel with the detector 304. As described in greater detail below, the optical switch 314 changes state (e.g., from an on state to an off state), with a first time constant, in response to the first superconducting component transitioning from the superconducting state to the non-superconducting state. In some embodiments, the electrical switch 316 changes state, with a second time constant shorter than the first time constant, in response to the first superconducting component transitioning from the superconducting state to the non-superconducting state. Thus, when the first superconductive component is operational (e.g., defect-free), a photon-induced transition of the first superconducting component from the superconducting state to the non-superconducting state causes the electrical switch 316 to change state (e.g., from an off/conductive state to an on/resistive state), which can be read out as a detected photon.

FIG. 4 is a schematic diagram of a photon detector 400 that includes a plurality of the detecting sections 300 (e.g., detecting sections 300a-300d) shown in FIG. 3, in accordance with some embodiments.

Each photon detecting section of the plurality of detecting sections 300 is coupled (e.g., weakly coupled) to a waveguide 102 (e.g., the same waveguide 102) when the corresponding optical switch 314 is in an on state. For example, waveguide 312a is coupled to waveguide 102 when optical switch 314a is in an on state; waveguide 312b is coupled to waveguide 102 when optical switch 314b is in an on state; waveguide 312c is coupled to waveguide 102 when optical switch 314c is in an on state; and waveguide 312d is coupled to waveguide 102 when optical switch 314d is in an on state. As noted above, in some embodiments, each optical switch 314 is in an on state when the corresponding photon detecting section 300 is operational (e.g., the corresponding detector 304 is free of defects that prevent it from being in a superconducting state under operating conditions, including while subject to the bias current provided by current source 404a).

Thus, in some embodiments, there is a non-zero but relatively small probability that a photon in waveguide 102 will transfer to any particular operational photon detecting section 300 and a zero or nearly zero probability that a photon will transfer to any non-operational photon detecting section 300. In some embodiments, there is a high probability (e.g., greater than 90%) that a photon in waveguide 102 transfers to one of the plurality of detecting sections 300.

As described with reference to FIG. 4 above, each waveguide 312 is strongly coupled to a detector 304 (e.g., a superconducting component). For example, waveguide 312a is strongly coupled to detector 304*a*; waveguide 312*b* is strongly coupled to detector 304*b*; waveguide 312*c* is strongly coupled to detector 304*c*; and waveguide 312*d* is strongly coupled to detector 304*d*.

In some embodiments, the plurality of detecting sections 300 are electrically coupled in series. A current source 404*a* provides a current I (FIG. 5) to (e.g., across) the plurality of detecting sections 300 arranged in series. In some embodiments (e.g., when each detecting section 300 comprises a superconducting component), the current I is a bias current that is below a threshold current for the detecting sections 300 and above a hotspot current for the detecting sections 300. In some embodiments, each of the detecting sections 300 has the same threshold current. In some embodiments, each of the detecting sections 300 has the same hotspot current. In some embodiments, each detecting section 300 is substantially identical (e.g., within specifications and aside from defects).

As described above with reference to FIG. 3, each photon detecting section 300 includes a detector 304 and an electrical switch 316. For example, photon detecting section 300*a* includes detector 304*a* and electrical switch 316*a*; photon detecting section 300*b* includes detector 304*b* and electrical switch 316*b*; photon detecting section 300*c* includes detector 304*c* and electrical switch 316*c*; and photon detecting section 300*d* includes detector 304*d* and electrical switch 316*d*. Each electrical switch 316 controls (e.g., changes) a resistance of a corresponding switch-controlled resistor 318 (e.g., a variable resistor). For example, electrical switch 316*a* controls the resistance of switch-controlled resistor 318*a*; electrical switch 316*b* controls the resistance of switch-controlled resistor 318*b*; electrical switch 316*c* controls the resistance of switch-controlled resistor 318*c*; and electrical switch 316*d* controls the resistance of switch-controlled resistor 318*d*. In some embodiments, the switch-controlled resistors 318 are electrically-coupled in series. In some embodiments, the switch-controlled resistors 318, together comprise a readout line that receives a readout current from current source 404*b*.

Readout circuitry 420 is configured to measure (e.g., directly or indirectly) a change in the resistance of the variable resistor formed from switch-controlled resistors 318. For example, readout circuitry 420 determines whether any of the switch-controlled resistors 318 are in a high-resistance state and, optionally, how many of the switch-controlled resistors 318 are in a high-resistance state (e.g., to determine whether a photon has been detected and, optionally, how many photons have been detected). In some embodiments, readout circuitry 420 measures a voltage at the end of the readout line, and photon detection is determined by observing changes in the voltage (e.g., "pings" from detected photons).

In some embodiments, the plurality of detecting sections 300 are integrated on the same substrate. In some embodiments, each photon detecting section of the plurality of detecting sections 300 comprises a distinct instance of a common set of one or more layers formed on or over the substrate. For example, each electrical switch 316 comprises a distinct instance of a common set of one or more electrical switch layers; each detector 304 comprises a distinct instance of a common set of one or more detector layers; each waveguide 312 comprises a distinct instance of a common set of one or more waveguide layers; and each optical switch 314 comprises a distinct instance of a common set of one or more optical switch layers. In some embodiments, the waveguide 102 is integrated on the same substrate as the plurality of detecting sections 300. In some embodiments, the switch-controlled resistors 318 are integrated on the same substrate as the plurality of detecting sections 300. In some embodiments, one or more of the current sources 404 is integrated on the same substrate as the plurality of detecting sections 300. In some embodiments, readout circuitry 420 is integrated on the same substrate as the plurality of detecting sections 300. In some embodiments, the entire photon detector 400 is integrated on the same substrate.

Figure 5:
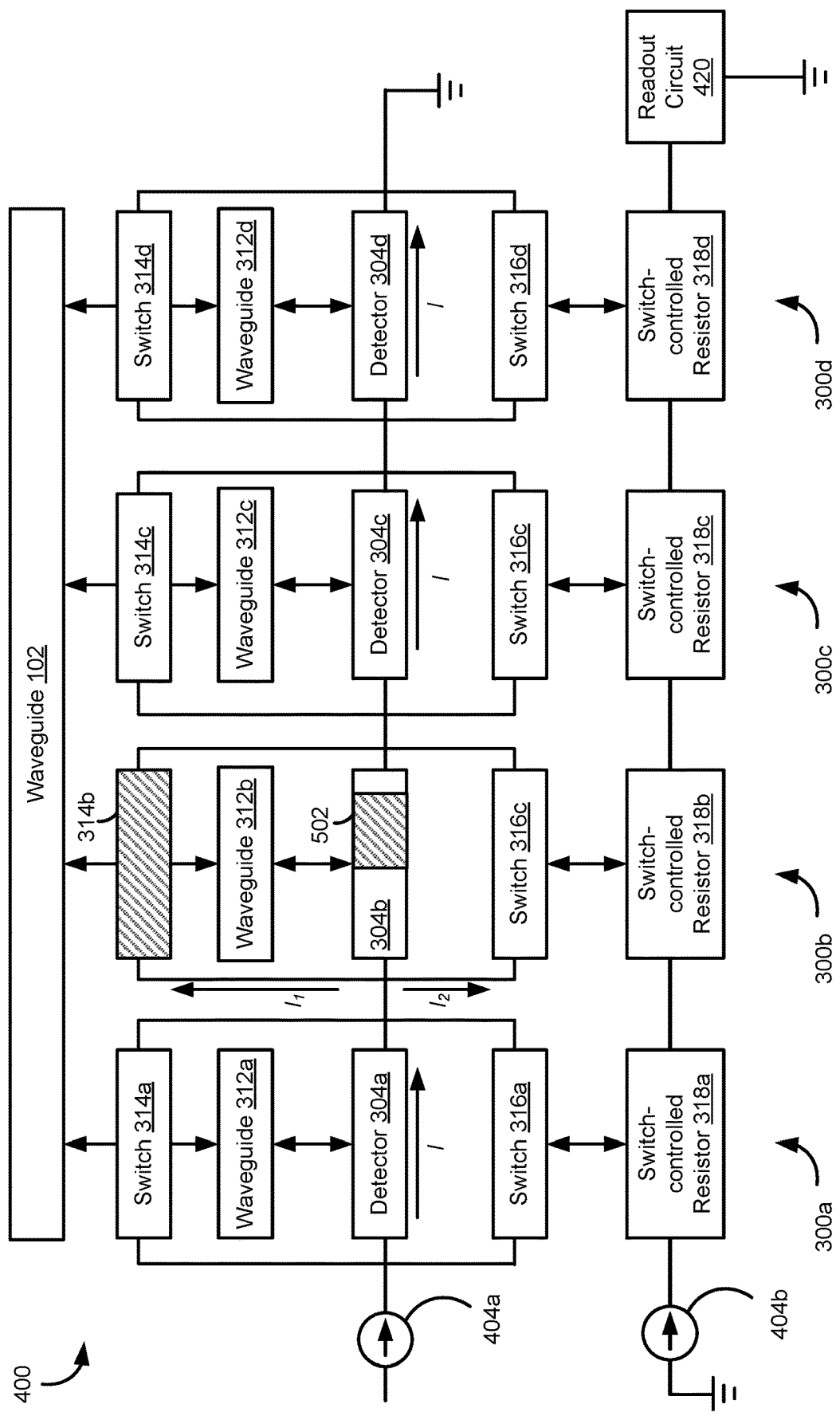
FIG. 5 is a schematic diagram illustrating operation of the photon detector of FIG. 4 in which one of the photon detecting sections is not operational, in accordance with some embodiments.

FIG. 5 is a schematic diagram illustrating operation of the photon detector 400, except that one of the photon detecting sections is not operational, in accordance with some embodiments. In this example, photon detector 304*b* is not operational (e.g., has a persistent defect), rendering detecting section 300*b* non-operational under operating conditions.

Note that when a respective detector 304 comprises an operational superconducting component, in steady-state, substantially all of the current I from the current source 404*a* (e.g., the bias current) is routed to the detector 304 because of its zero-resistance, as is the case with detector 304*a*, detector 304*c*, and detector 304*d*. In some embodiments, in the absence of a current applied to a respective optical switch 314, the respective optical switch 314 optically couples waveguide 102 to the corresponding detector 304. Thus, in this example, optical waveguide 102 is optically coupled to detector 304*a*, detector 304*c*, and detector 304*d*.

On the other hand, when a respective detector 304 comprises a non-operational superconducting component, in steady state (e.g., in the presence of a persistent defect 502), a portion $I_1$ of the bias current I is routed to the optical switch 314 and another portion $I_2$ of the bias current I is routed to the electrical switch 316 (as used herein, the term steady-state refers to a DC behavior of the system or circuit). Note that an additional portion of the current, not labeled, may still pass through the detector 304 when the detector is in a non-superconducting state (e.g., the non-superconducting state is a resistive state rather than an insulating state). In some embodiments, the photon detecting sections 300 are configured such that the portion $I_1$ of the bias current routed to the optical switch 314 is sufficient to control the state of the optical switch 314 (e.g., sufficient to de-couple waveguide 102 from the corresponding waveguide 312). In this example, in steady state, the waveguide 102 is optically de-coupled from detector 304*b*. In some embodiments, the portion $I_2$ of the bias current routed to the electrical switch 316, in steady state, is not sufficient to change the state of the electrical switch 316 (e.g., the portion of the current $I_2$ is below a threshold for changing the state of the electrical switch). In some embodiments, the circuit ground of each of the photon detecting sections 300 is, or is coupled to, a terminal portion of the corresponding detector 304. As a result, all portions of the bias current I delivered to non-operational photon detecting section 300*b*, including portions $I_1$ and $I_2$, are delivered to the detector 304*c* in the next photon detecting section 300*c*.

Thus, photon detector 400 prevents photons from being transferred to "dark spots" in the photon detector 400 (e.g., detecting section 300*b*, which is not operational and thus not capable of being read out). Moreover, in some embodiments, detector 400 includes a plurality of other detecting sections 300 capable of detecting the photon. In this manner, photon detector 400 is very likely to detect a photon travelling in waveguide 102, and yet does not lose photons to dark spots in the photon detector 400.

Figure 6:
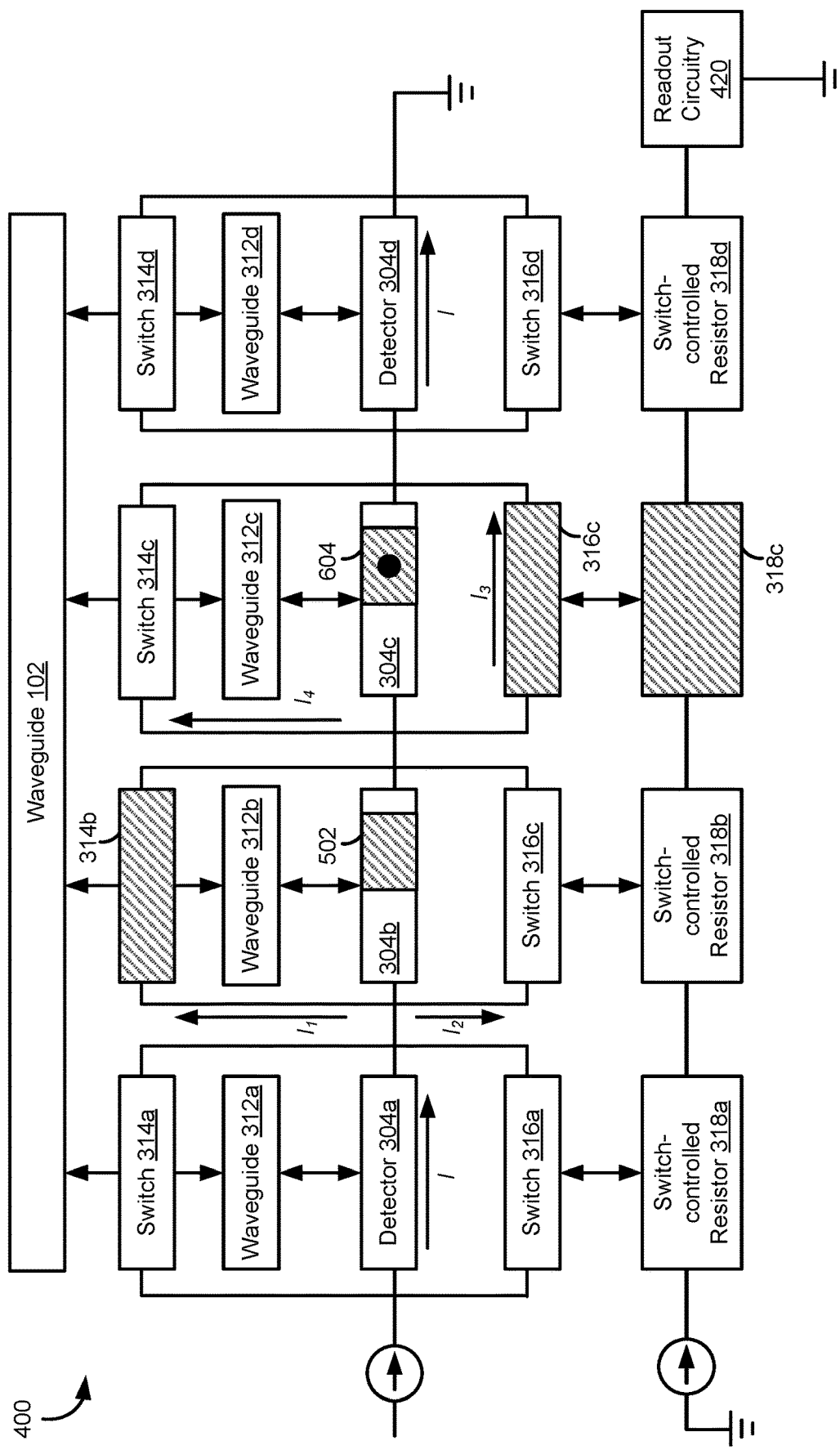
FIG. 6 is a schematic diagram illustrating operation of the photon detector of FIG. 5 when a photon is detected by one of the photon detecting sections, in accordance with some embodiments.

FIG. 6 is a schematic diagram illustrating operation of the photon detector 400 of FIG. 5 when a photon is detected by one of the detecting sections 300 (e.g., detecting section 300c), in accordance with some embodiments. As noted above, in some embodiments, the current I is a bias current that is less than a superconducting threshold current for the detectors 304 (e.g., the current I). In some embodiments, the critical current I is selected such that a single photon impinging a respective detector 304 causes the respective detector 304 to transition to a non-superconducting state (e.g., the bias current is greater than a hotspot current for the detectors 304).

FIG. 6 illustrates a photon-induced (e.g., photon-triggered) hotspot 604, causing a portion of detector 304c (which is operational) to transition to a non-superconducting state. In this example, it is assumed that the photon was travelling along waveguide 102, transferred to waveguide 312c, and impinged detector 304c, causing the photon-induced hotspot 604. When detector 304c is in the non-superconducting state, a portion of the current $I_3$ is routed to the electrical switch 316c and a portion of the current $I_4$ is routed to the optical switch 314c. However, in some embodiments, optical switch 314c has a large inductance, either inherently or by the addition of an inductor. For example, optical switch 314c has a first inductance that is larger than a second inductance of electrical switch 316c. Thus, on relevant timescales (e.g., timescales corresponding to the readout time of readout circuitry 420, the portion of current $I_4$ routed to optical switch 314c is small (e.g., much smaller than the steady state portion $I_1$) and the portion of current $I_3$ routed to switch 316c is concomitantly larger (e.g., larger than the steady state portion $I_2$). In some embodiments, the detecting sections 300 are configured such that the portion of current routed to the electrical switch 316c in response to detector 304c detecting a photon is sufficient to change the state of the electrical switch 316c, which in turns changes the state of the switch-controlled resistor 318c.

After detecting a photon, in some circumstances, the photon-induced hotspot 604 dissipates (e.g., before optical switch 314c changes state) and the detecting section 300c is ready to detect another photon.

In some embodiments, each electrical switch 316, together with the corresponding switch controlled resistor 318, comprises a trans-impedance device (e.g., an impedance amplifier). Thus, in some embodiments, each switch 316 has a relatively low impedance even in its off state (at least compared to a high impedance state of the corresponding switch-controlled resistor 318. The impedance of switch 316 is thus amplified by controlling the resistance of switch-controlled resistor 318c, which creates larger voltage swings for the readout circuitry 420 to read.

FIGS. 7-10 illustrate example embodiments of such impedance amplifiers. One of skill in the art, however, having had the benefit of this disclosure, will recognize that other impedance amplifiers are possible and fall within the scope of the appended claims.

Figure 7:
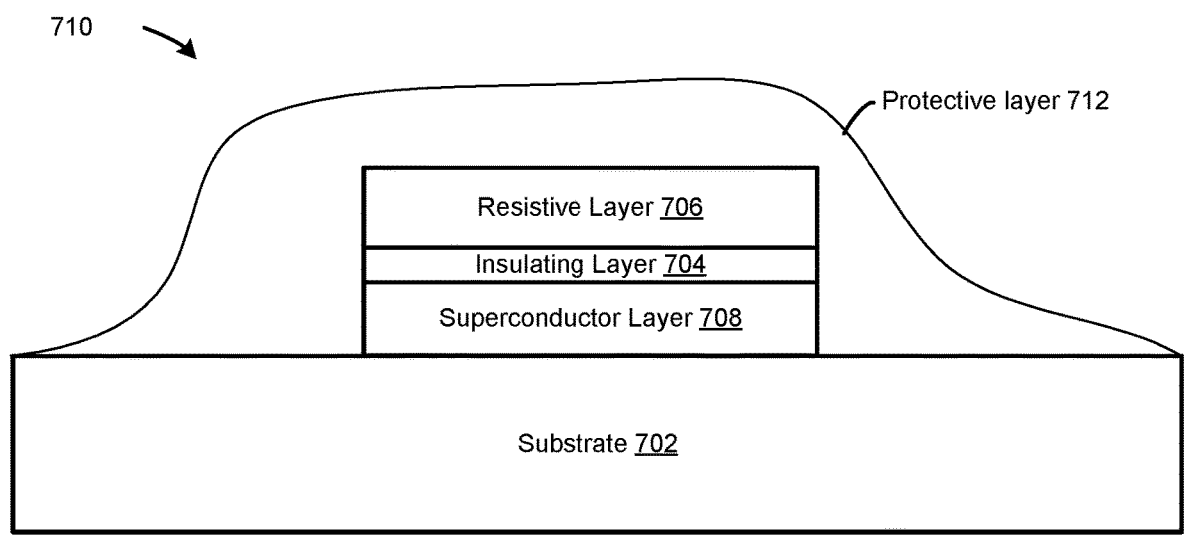
FIG. 7 is a schematic diagram of an impedance amplifier comprising a resistive layer that controls a resistance of a variable resistor (e.g., a superconducting layer), in accordance with some embodiments.

FIG. 7 is a schematic diagram of an impedance amplifier 710 comprising a resistive layer 706 (e.g., a resistive heater) that controls a resistance of a variable resistor (e.g., a superconducting layer 708, an example of a superconducting component), in accordance with some embodiments. The impedance amplifier 710 is fabricated on a substrate 702. In some embodiments, the impedance amplifier 710 includes an insulating layer 704 that electrically-insulates, but thermally couples, resistive layer 706 from superconducting layer 708. In some embodiments, the impedance amplifier 710 further includes a protective layer 712.

In some embodiments, resistive layer 706 is or comprises a portion of an electrical switch 316 (FIGS. 3-6). In some embodiments, superconducting layer 708 is or comprises a portion of a switch-controlled resistor 318 (FIGS. 3-6). Thus, when the portion of the current $I_3$ is routed to switch 316c (e.g., as shown in FIG. 6), resistive layer 706 generates resistive heat. In some embodiments, impedance amplifier 710 is configured such that, when resistive layer 706 receives a current above a predefined threshold, the resistive layer 706 generates sufficient heat to (e.g., enough heat transfers to) superconducting layer 708 to transition the superconducting layer 708 to a non-superconducting (e.g., resistive or insulating) state (e.g., by increasing a temperature of the superconducting layer 708 above a superconducting threshold temperature for the superconducting layer 708). In some embodiments, the portion of the current $I_3$ routed to electrical switch 316c is above the current threshold. In the non-superconducting state, the superconducting layer 708 has a higher resistance than the resistive layer 706, and thus impedance amplification is achieved.

Figure 8:
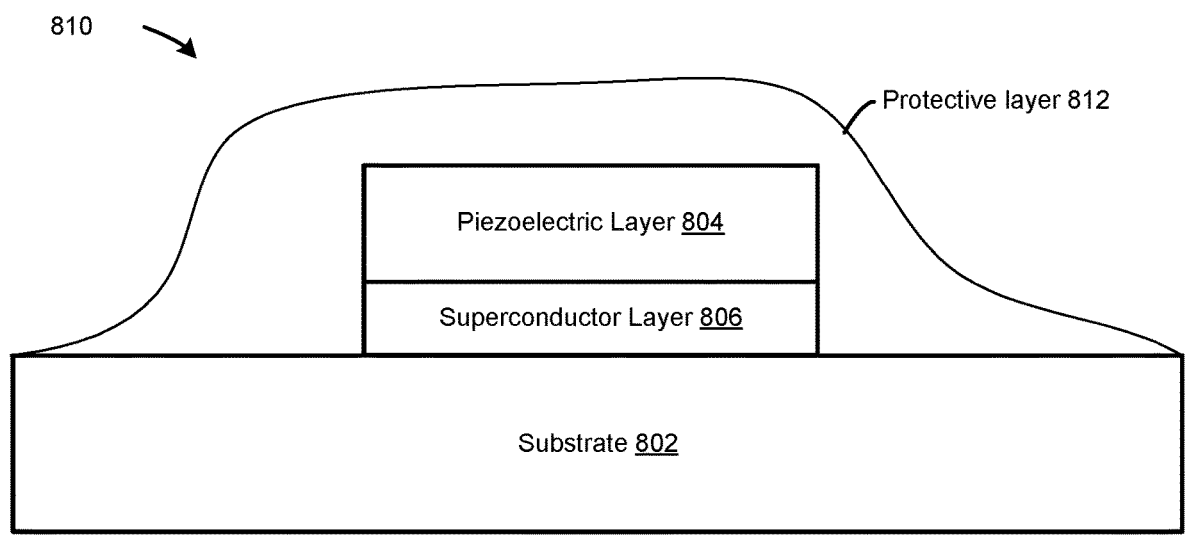
FIG. 8 is a schematic diagram of an impedance amplifier comprising a piezoelectric layer (e.g., a piezoelectric component) that controls a resistance of a variable resistor (e.g., a superconducting layer), in accordance with some embodiments.

FIG. 8 is a schematic diagram of an impedance amplifier 810 comprising a piezoelectric layer 804 (e.g., a piezoelectric component) that controls a resistance of a variable resistor (e.g., a superconducting layer 806), in accordance with some embodiments. The impedance amplifier 810 is fabricated on a substrate 802. In some embodiments, the impedance amplifier 710 further includes a protective layer 812. Note that, in various embodiments, the piezoelectric layer 804 may be below the superconducting layer 806 and may in fact comprise the substrate 802 (e.g., the substrate may be a piezoelectric substrate).

In some embodiments, piezoelectric layer 804 is or comprises a portion of an electrical switch 316 (FIGS. 3-6). In some embodiments, superconducting layer 806 is or comprises a portion of a switch-controlled resistor 318 (FIGS. 3-6). In some embodiments, superconducting layer 806 undergoes a non-thermal phase transition from a superconducting state and a non-superconducting state (e.g., insulating state) in response to a strain applied by piezoelectric layer 804. In some embodiments, the superconducting layer 806 is adapted to transition between the superconducting state and the non-superconducting state, in response to a strain applied by piezoelectric layer 804, by having a thickness slightly above a superconducting thickness threshold, e.g., within 5 nanometers (nm), 10 nm, or 20 nm of the superconducting thickness threshold.

Thus, when the portion of the current $I_3$ is routed to switch 316c (e.g., as shown in FIG. 6), piezoelectric layer 804 generates a strain in superconducting layer 806 (e.g., by virtue of being epitaxial or lattice-matched with superconducting layer 806). In some embodiments, impedance amplifier 810 is configured such that, when piezoelectric layer 804 receives a current above a predefined threshold, enough strain is applied to superconducting layer 806 to transition the superconducting layer 806 to a non-superconducting (e.g., insulating) state. In some embodiments, the portion of the current $I_3$ routed to switch 316c is above the current threshold. In the non-superconducting state, the superconducting layer 806 has a higher resistance than the piezoelectric layer 804, and thus impedance amplification is achieved.

Figure 9A:
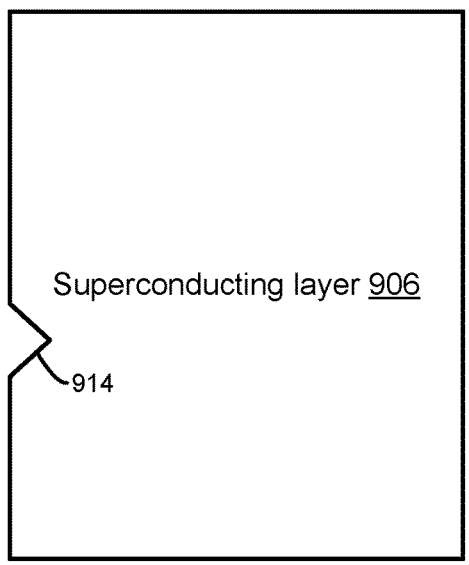
FIGS. 9A-9B are schematic diagrams of an impedance amplifier comprising a superconductor layer that controls a resistance of a variable resistor (e.g., a superconducting layer), in accordance with some embodiments.
Figure 9B:
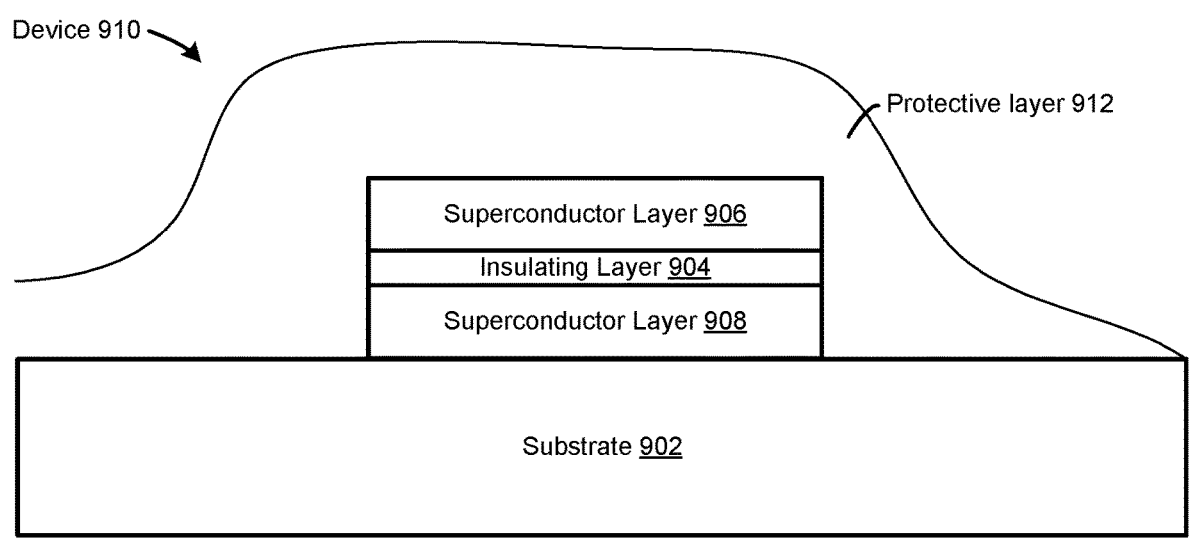

FIGS. 9A-9B are schematic diagrams of an impedance amplifier 910 comprising a first superconducting layer 906 that controls a resistance of a variable resistor (e.g., a second superconducting layer 908, an example of a superconducting component), in accordance with some embodiments. The impedance amplifier 910 is fabricated on a substrate 902. In some embodiments, the impedance amplifier 910 includes an insulating layer 904 that electrically-insulates the first superconducting layer 906 from the second superconducting layer 908. In some embodiments, the impedance amplifier 910 further includes a protective layer 912.

In some embodiments, first superconducting layer 906 is or comprises a portion of an electrical switch 316 (FIGS. 3-6). In some embodiments, the second superconducting layer 908 is or comprises a portion of a switch-controlled resistor 318 (FIGS. 3-6). In some embodiments, the first superconducting layer 906 is configured to transition to a non-superconducting state in response to the portion of the current $I_3$ being routed to switch 316c. In some embodiments, the second superconducting layer 908 is configured to transition to a non-superconducting state in response to the first superconducting layer 906 transitioning to a non-superconducting state. For example, in some embodiments, the first superconducting layer 906 generates resistive heat in the non-superconducting state that transfers to the second superconducting layer 908. In some embodiments, impedance amplifier 910 is configured such that, when the first superconducting layer 906 receives a current above a predefined threshold, enough heat transfers to superconducting layer 908 to transition the superconducting layer 908 to a non-superconducting (e.g., insulating) state. In some embodiments, the portion of the current $I_3$ routed to switch 316c is above the predefined threshold. In the non-superconducting state, the first superconducting layer 908 has a higher resistance than the first superconducting layer 906, and thus impedance amplification is achieved.

In some embodiments, the first superconducting layer 906 has one or more geometric features, such as constriction 914, that lower the threshold for transitioning to a non-superconducting state. In this manner, the threshold current for the first superconducting layer 906 can be controlled and adapted to the current that is received in response to detecting a photon (FIG. 6).

Figure 10:
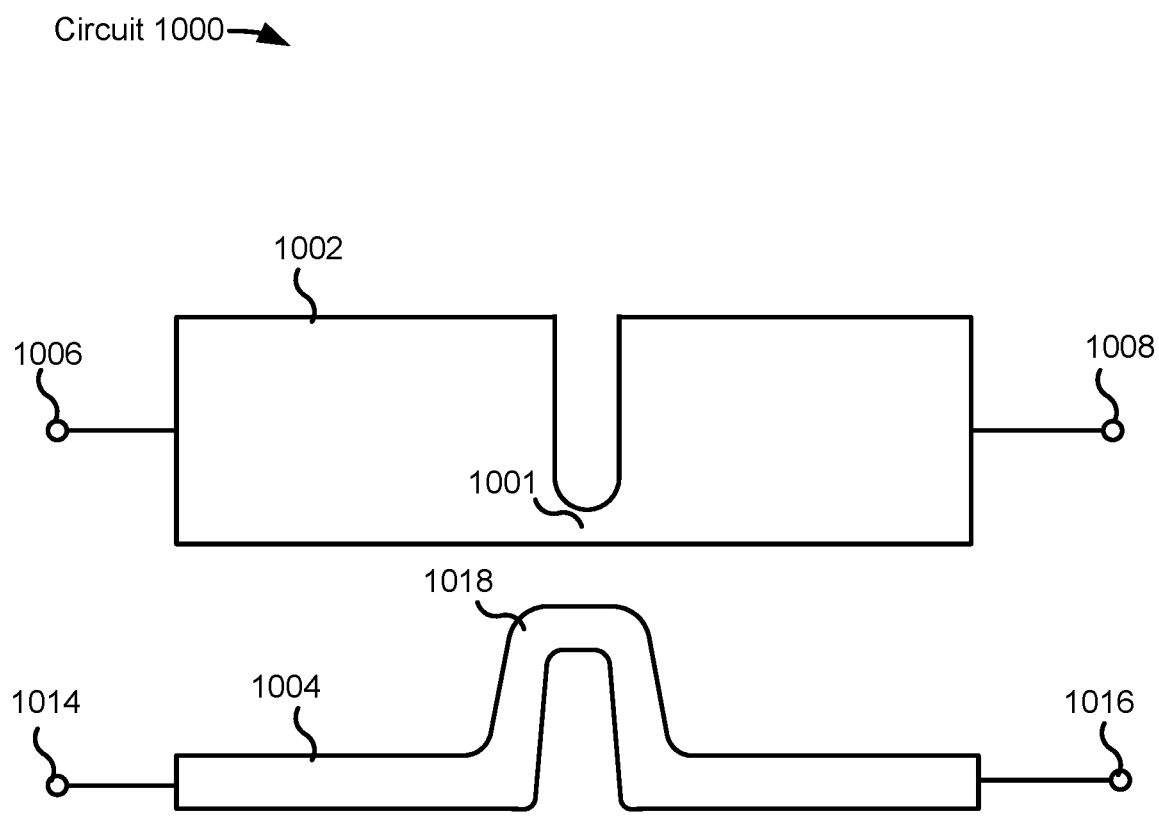
FIG. 10 is a schematic diagram of an impedance amplifier comprising a component (e.g., a resistive or superconducting component) that controls a resistance of a superconducting component (e.g., a superconducting layer), in accordance with some embodiments.

FIG. 10 is a schematic diagram of an impedance amplifier 1000 comprising a component 1004 that controls a resistance of a variable resistor (e.g., a superconducting component 1002), in accordance with some embodiments. In some embodiments, component 1004 is a superconductor, while in some other embodiments, component 1004 is a non-superconducting component, e.g., a resistive component formed from a metal material, a semiconducting material or any other resistive material. In some embodiments, component 1004 comprises a metal and/or doped semiconductor. In embodiments in which component 1004 comprises a metal or doped semiconductor, some heat is generated through region 1018 of component 1004 as current flows between terminals 1014 and 1016. In some embodiments, component 1004 and superconducting component 1002 are co-planer (e.g., formed from layers of material that are next to each other). In some embodiments, component 1004 and superconducting component 1002 are distinct instances of a common layer of material (e.g., superconducting material) deposited on a substrate.

FIG. 10 further shows terminals 1006 and 1008 connected to the superconducting component 1002 and terminals 1014 and 1016 connected to the component 1004. Superconducting component 1002 includes constriction region 1001 adjacent to region 1018 of component 1004, which thermally-couples components 1002 and 1004. Although not shown in FIG. 10, in some embodiments, the components 1002 and 1004 are thermally coupled by a coupling component.

In some embodiments, component 1004 is or comprises a portion of an electrical switch 316 (FIGS. 3-6). In some embodiments, the superconducting component 1002 is or comprises a portion of a switch-controlled resistor 318 (FIGS. 3-6). In some embodiments, impedance amplifier 1000 is configured such that, when component 1002 receives a current above a predefined threshold, the component 1002 generates sufficient heat (e.g., enough heat transfers to superconducting component 1004) such that the superconducting component 1004 transitions to a non-superconducting (e.g., resistive or insulating) state (e.g., by increasing a temperature of the superconducting component 1004 above a superconducting threshold temperature for the superconducting component 1004). In some embodiments, the portion of the current $I_3$ routed to electrical switch 316c is above the current threshold. In the non-superconducting state, the superconducting component 1002 has a higher resistance than the component 1004, and thus impedance amplification is achieved.

In some embodiments, only a portion of the component 1004, region 1018, is in close proximity to the superconducting component 1002. In some circumstances, having only a portion of the component 1004 in proximity to the superconducting component 1002 allows for more control over the heat transfer between the components 1002 and 1004 and reduces heat dissipation effects of the component 1004 by isolating the region 1018.

In the embodiments, the superconducting components or regions that are positioned adjacent to each other so as to allow the transfer of heat from one to the other are, at the same time, positioned so as to inhibit (e.g., prevent) cooper pair and/or electron tunneling between those superconducting components or regions (e.g., they are positioned 10 nm, 100 nm, or more apart).

One of skill in the art will appreciate that various other methods and devices for impedance amplification and multiplication may be used. For example, additional embodiments of impedance amplifiers are described in U.S. patent application Ser. No. 16/136,124, entitled "Methods and Devices for Impedance Multiplication," filed Sep. 19, 2018 and U.S. patent application Ser. No. 16/107,143, entitled "Superconductor-to-Insulator Devices," filed Aug. 21, 2018, each of which is incorporated by reference in its entirety.

Figure 11C:
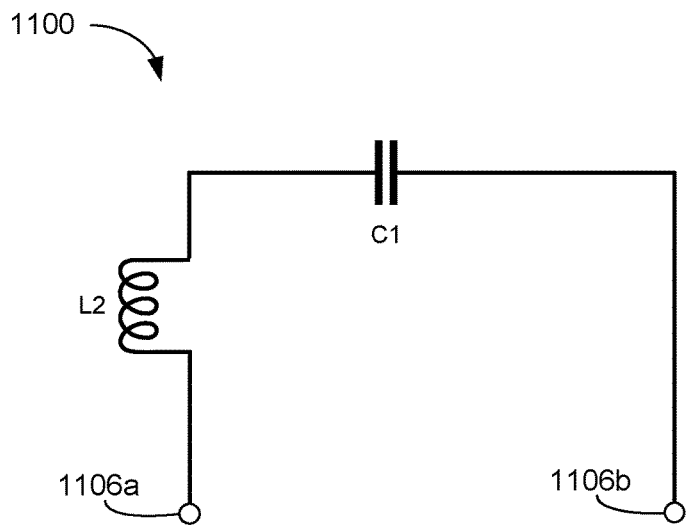

FIGS. 11A-11C are schematic diagrams of a micro-opto-electro-mechanical system (MOEMS) switch 1100, in accordance with some embodiments. MOEMS switch 1100 includes a first optical coupling component 1102a and a second optical coupling component 1102b. In some embodiments, MOEMS switch 1100 includes an added inductor 1104 having a first inductance L1.

Referring to FIG. 11B, in some embodiments, first optical coupling component 1102a includes waveguide 1108a and second optical coupling component 1102b includes waveguide 1108b. In some embodiments, first optical coupling component 1102a and second optical coupling component 1102b each include a capacitive plate (e.g., the capacitive plates couple with external circuitry via terminal 1106a and terminal 1106b, respectively). For example, first optical coupling component 1102a includes capacitive plate 1110a and second optical coupling component 1102b includes capacitive plate 1110b.

In some embodiments, capacitive plates 1110a and 1110b form a deformable capacitor. In some embodiments, waveguides 1108a and 1108b are deformable waveguides mechanically-coupled to capacitive plates 1110a and 1110b, respectively. In some embodiments, an optical coupling between the first optical coupling component 1102a and the second optical coupling component 1102b is controlled by a voltage between the first optical coupling component 1102a and the second optical coupling component 1102b (e.g., between the capacitive plates of the first optical coupling component 1102a and the second optical coupling component 1102b). For example, when a first voltage (e.g., a non-zero voltage) is applied between the first optical coupling component 1102a and the second optical coupling component 1102b, first optical coupling component 1102a and second optical coupling component 1102b are deformed (e.g., pulled) so as to be sufficiently near each other so that photons in waveguide 1108a of first optical coupling component 1102a are evanescently coupled to the waveguide 1108b of second optical coupling component 1102b (e.g., the MOEMS optical switch is in an "on" state). In some embodiments, when a second voltage (e.g., zero voltage, or a voltage less than a threshold voltage) is applied between the first optical coupling component 1102a and the second optical coupling component 1102b, first optical coupling component 1102a and second optical coupling component 1102b are not deformed (e.g., pulled) so as to be sufficiently near each other to evanescently couple first optical coupling component 1102a and second optical coupling component 1102b (e.g., the MOEMS optical switch is in an "off" state).

In some embodiments, MOEMS switch 1100 includes circuitry to transition MOEMS switch 1100 to an "off" state in response to receiving a current (e.g., current $I_1$, FIG. 5) and maintain MOEMS switch 1110 in an "on" state when no current is received (e.g., such that waveguide 302 and waveguide 312 are coupled when detector 304 is operable, as shown in FIG. 3). For example, in some embodiments, MOEMS switch 1100 includes or is coupled with a voltage source configured to bias the capacitive plates 1110a and 1110b to maintain the MOEMS switch 1100 in an "on" state absent the current $I_1$. In some embodiments, MOEMS switch 1110 includes or is coupled with an inverter, which receives the current $I_1$, such that the current $I_1$ results in a voltage applied to the capacitive plates 1110a and 1110b that has an opposite sign relative to the bias voltage (thus un-biasing the MOEMS switch 1110 and transitioning it to an off state).

FIG. 11C illustrates an equivalent electrical circuit of MOEMS switch 1100, in accordance with some embodiments. The equivalent electrical circuit includes an equivalent capacitance C1 (e.g., which includes the capacitance of the capacitive plates 1110a and 1110b, as well as any inherent or parasitic capacitance). The equivalent electrical circuit includes an equivalent inductance L2 (e.g., which includes the inductance L1 of added inductor 1104, as well as any inherent or parasitic inductance). In some embodiments, the equivalent capacitance and inductance are tuned so to configure a time constant of the MOEMS switch 1100 (e.g., such that the MOEMS switch 1100 changes state in response to defects, but not in response to detection of photons, as described with reference to FIGS. 5-6).

Figure 12:
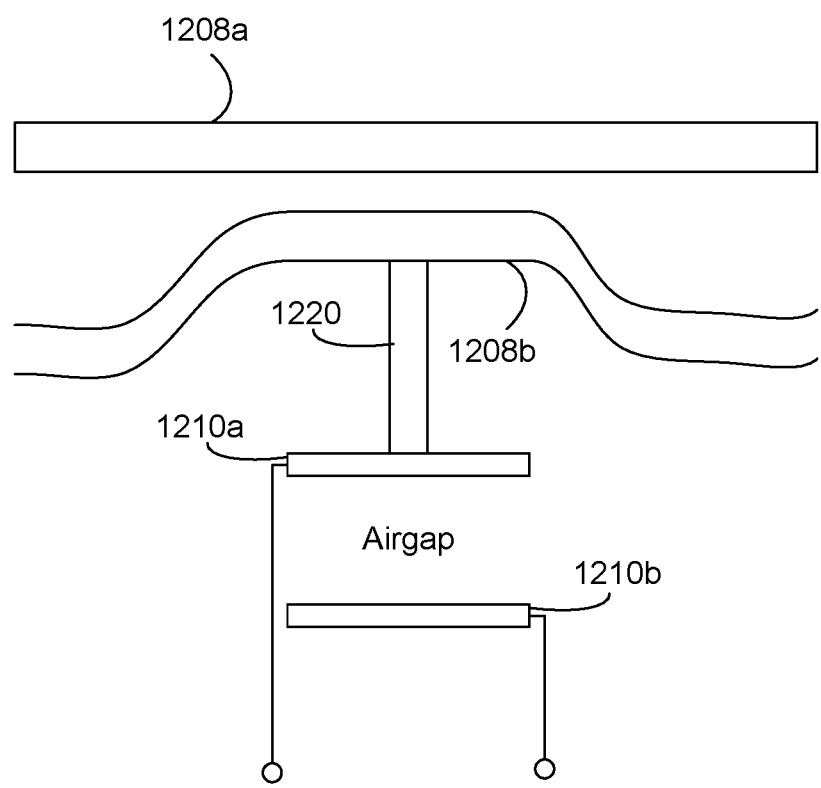
FIG. 12 is a schematic diagram of a MOEMS switch, in accordance with some embodiments.

FIG. 12 is a schematic of a MOEMS switch 1200, in accordance with some embodiments. MOEMS switch 1200 includes a first waveguide 1208a and a second waveguide 1208b (e.g., a deformable waveguide). In some embodiments, MOEMS switch 1200 includes an added inductor (not shown, but analogous to the added inductor 1104 described with reference to FIG. 11A). Second waveguide 1208b is mechanically-coupled to a capacitive plate 1210a that, together with capacitive plate 1210b, form a capacitor (e.g., a deformable capacitor). In some embodiments, the second waveguide 1208b is mechanically-coupled to capacitive plate 1210a by a mechanical coupling 1220, which physically separates second waveguide 1208b from capacitive plate 1210a so that capacitive plate 1210a is optically decoupled from waveguide 1208b.

In some embodiments, an optical coupling between the first waveguide 1208a and the second waveguide 1208b is controlled by a voltage between the first capacitive plate 1210a and the second capacitive plate 1210b. For example, when a first voltage (e.g., zero voltage, or a voltage less than a threshold voltage) is applied between the first capacitive plate 1210a and the second capacitive plate 1210b, first waveguide 1208a and second waveguide 1208b are sufficiently near each other to evanescently couple first waveguide 1208a and second waveguide 1208b (e.g., the MOEMS optical switch is in an "on" state). When a second voltage (e.g., a non-zero voltage) is applied between the first capacitive plate 1210a and the second capacitive plate 1210b, first waveguide 1208a and second waveguide 1208b are deformed (e.g., pulled) sufficiently far from each other so that photons in first waveguide 1208a are not evanescently coupled to the second waveguide 1208b (e.g., the MOEMS optical switch is in an "off" state).

In some embodiments, MOEMS switch 1200 is maintained in an "on" state when no current has been received by capacitive plates 1210 and transitions to an "off" state in response to receiving a current (e.g., current $I_1$, FIG. 5) (e.g., such that waveguide 302 and waveguide 312 are coupled when detector 304 is operable, as shown in FIG. 3).

MOEMS switches 1100 and 1200, described above, are examples of optical switches that can be used as optical switch 314 (FIGS. 3-6). These particular examples are based on deformable capacitors and deformable waveguides. One of skill in the art, however, having had the benefit of this disclosure, will recognize that other optical switches are possible and fall within the scope of the appended claims. In some embodiments, a suitable optical switch 314 may be actuated by a piezo-opto-mechanical coupling, electro-optic modulation, or a thermo-optic tuning. For example, in some embodiments, a voltage is used to drive a piezoelectric material such as aluminum nitride (AlN), which in turn modulates the phase and amplitude of an optical coupling between two waveguides.

It will be understood that, although the terms first, second, etc. are, in some instances, used herein to describe various elements, these elements should not be limited by these terms. These terms are only used to distinguish one element from another. For example, a first current could be termed a second current, and, similarly, a second current could be termed a first current, without departing from the scope of the various described embodiments. The first current and the second current are both currents, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments.

However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A photon detecting component, comprising:
   a first waveguide;
   a detecting section, comprising:
      a second waveguide;
      a detector, optically coupled with the second waveguide, configured to detect one or more photons in the second waveguide;
      an optical switch configured to provide an optical coupling between the first waveguide and the second waveguide when the detector is operational; and
      an electrical switch electrically coupled to the detector, wherein the electrical switch is configured to change state in response to the detector detecting one or more photons; and
   readout circuitry configured to determine a state of the electrical switch of the detecting section.

2. The photon detecting component of claim 1, wherein the detector comprises a first superconducting component configured to transition from a superconducting state to a non-superconducting state in response to detecting one or more photons.

3. The photon detecting component of claim 2, wherein:
   the optical switch and the electrical switch are connected in parallel with the first superconducting component;
   the optical switch changes state, with a first time constant, in response to the first superconducting component transitioning from the superconducting state to the non-superconducting state; and
   the electrical switch changes state, with a second time constant shorter than the first time constant, in response to the first superconducting component transitioning from the superconducting state to the non-superconducting state.

4. The photon detecting component of claim 3, wherein the optical switch has a first inductance and the electrical switch has a second inductance that is lower than the first inductance.

5. The photon detecting component of claim 1, further including a current source configured to provide a current across the detecting section, wherein a first portion of the current is routed to the electrical switch in response to the detector detecting one or more photons.

6. The photon detecting component of claim 5, wherein, when the detector is not operational:
   a second portion of the current is routed to the optical switch; and
   a third portion of the current is routed to the electrical switch, wherein the third portion of the current is below a threshold for changing the state of the electrical switch.

7. The photon detecting component of claim 1, wherein:
   the electrical switch is coupled with a variable resistor of a readout line;
   the electrical switch is configured to, in response to the detector detecting one or more photons, change the resistance of the variable resistor; and
   wherein the readout circuitry is configured to measure a change in the resistance of the variable resistor.

8. The photon detecting component of claim 7, wherein:
   the electrical switch comprises a second superconducting component configured to transition from a superconducting state to a non-superconducting state in response to the detector detecting one or more photons.
   the variable resistor comprises a third superconducting component thermally coupled with the second superconducting component; and
   the second superconducting component is configured to generate sufficient heat in the non-superconducting state to increase a temperature of the third superconducting component above a superconducting threshold temperature for the third superconducting component.

9. The photon detecting component of claim 7, wherein:
   the electrical switch comprises a resistive heater;
   the variable resistor comprises a third superconducting component thermally coupled with the resistive heater; and
   when a current above a predefined threshold is applied across the resistive heater, the resistive heater is configured to generate sufficient heat to increase a temperature of the third superconducting component above a superconducting threshold temperature for the third superconducting component.

10. The photon detecting component of claim 7, wherein:
    the variable resistor comprises a third superconducting component configured to transition from a superconducting state to a non-superconducting state in response to a first strain; and
    the electrical switch comprises a piezoelectric component configured to apply the first strain to the third superconducting component in response to the detector detecting one or more photons.

11. The photon detecting component of claim 1, comprising:
    a plurality of detecting sections, each detecting section of the plurality of detecting sections comprising:
       a respective second waveguide;
       a respective detector, optically coupled with the respective second waveguide, configured to detect photons in the respective second waveguide;
       a respective optical switch configured to provide an optical coupling between the first waveguide and the respective second waveguide when the respective detector is operational; and
       a respective electrical switch electrically coupled to the respective detector, wherein the respective electrical switch is configured to change state in response to the respective detector detecting one or more photons; and
    wherein the readout circuitry is configured to determine a state of the respective electrical switch of each detecting section of the plurality of detecting sections.

12. The photon detecting component of claim 1, wherein the optical switch is a micromechanical optical switch.

* * * * *